US012628484B2

(12) United States Patent
Choi et al.

(10) Patent No.: US 12,628,484 B2
(45) Date of Patent: May 12, 2026

(54) DISPLAY DEVICE AND METHOD OF FABRICATING THE SAME

(71) Applicant: Samsung Display Co., LTD., Yongin-si (KR)

(72) Inventors: Jin Woo Choi, Seoul (KR); Sung Kook Park, Suwon-si (KR); Sung Eun Baek, Suwon-si (KR); Dae Ho Song, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 742 days.

(21) Appl. No.: 17/751,169

(22) Filed: May 23, 2022

(65) Prior Publication Data

US 2023/0042855 A1     Feb. 9, 2023

(30) Foreign Application Priority Data

Aug. 9, 2021     (KR) ........................ 10-2021-0104921

(51) Int. Cl.
*H10H 20/831* (2025.01)
*H10H 29/14* (2025.01)

(52) U.S. Cl.
CPC ...... *H10H 29/142* (2025.01); *H10H 20/8314* (2025.01)

(58) Field of Classification Search
CPC ..... H01L 27/153; H01L 27/156; H01L 33/04; H01L 33/36; H01L 2933/0016; H10H 29/142; H10H 29/14; H10H 20/8314; H10H 20/83; H10H 20/032; H10H 20/574; H10H 20/811
See application file for complete search history.

(56) References Cited

U.S. PATENT DOCUMENTS

| | | | |
|---|---|---|---|
| 10,297,654 B2 | 5/2019 | Motoyama et al. |
| 11,476,317 B2 | 10/2022 | Motoyama et al. |
| 11,522,006 B2 | 12/2022 | Lee et al. |
| 11,756,984 B2 | 9/2023 | Lee et al. |
| 11,973,104 B2 | 4/2024 | Lee et al. |
| 12,035,579 B2 | 7/2024 | Motoyama et al. |
| 12,183,773 B2 | 12/2024 | Lee et al. |
| 2023/0027490 A1 | 1/2023 | Kang et al. |
| 2024/0266385 A1 | 8/2024 | Lee et al. |

(Continued)

FOREIGN PATENT DOCUMENTS

| | | | | | |
|---|---|---|---|---|---|
| CN | 108987450 A | * | 12/2018 | .......... | H10K 50/805 |
| CN | 111580695 A | | 8/2020 | | |
| CN | 109285855 B | * | 12/2020 | .......... | H01L 27/156 |

(Continued)

*Primary Examiner* — Jay C Kim
*Assistant Examiner* — Joshua Scott Wyatt
(74) *Attorney, Agent, or Firm* — Womble Bond Dickinson (US) LLP

(57) ABSTRACT

A display device includes light-emitting elements arranged on a circuit substrate, extending in a thickness direction of the circuit substrate, and including a first light-emitting element configured to emit a first light, and a second light-emitting element configured to emit a second light, and having a width that is less than a width of the first light-emitting element, a common electrode layer above the light-emitting elements, and a connection electrode layer between the first light-emitting element and the common electrode layer.

15 Claims, 27 Drawing Sheets

(56)         References Cited

U.S. PATENT DOCUMENTS

| 2024/0349551 | A1 | 10/2024 | Motoyama et al. |
| 2025/0081705 | A1 | 3/2025 | Lee et al. |

FOREIGN PATENT DOCUMENTS

| CN | 116114063 | A | * | 5/2023 | ............. H10D 86/40 |
| KR | 10-2020-0091408 | A | | 7/2020 | |
| KR | 10-2021-0072006 | A | | 6/2021 | |
| KR | 10-2021-0079433 | A | | 6/2021 | |
| KR | 10- 2022-0149896 | A | | 11/2022 | |
| TW | 201320325 | A | | 5/2013 | |
| TW | 201532266 | A | | 8/2015 | |

* cited by examiner

300 : SUB, SEM3, CEL, CNL, ED1, ED2, ED3

DISPLAY DEVICE AND METHOD OF FABRICATING THE SAME

CROSS-REFERENCE TO RELATED APPLICATION

This application claims priority to, and the benefit of, Korean Patent Application No. 10-2021-0104921 filed on Aug. 9, 2021 in the Korean Intellectual Property Office, the disclosure of which is incorporated herein by reference in its entirety.

BACKGROUND

1. Field

The present disclosure relates to a display device and a method of fabricating the same.

2. Description of the Related Art

As the information-oriented society evolves, various demands for display devices are ever increasing. Display devices may be flat panel display devices such as a liquid-crystal display device, a field emission display device, and a light-emitting display device. Light-emitting display devices may include an organic light-emitting display device including organic light-emitting diodes as the light-emitting elements, an inorganic light-emitting display device including inorganic semiconductor elements as the light-emitting elements, and a micro-LED display device including a light-emitting diodes as the light-emitting elements.

Recently, a head mounted display including a light-emitting display device has been developed. A head mounted display (HMD) is a glasses-type monitor device providing virtual reality (VR) or augmented reality (AR) that is worn on a user's body in the form of glasses or a helmet to form a focus close to the user's eyes.

A high-resolution micro-LED display panel including micro light-emitting diodes is applied to head mounted displays.

SUMMARY

Aspects of the present disclosure provide a display device in which internal quantum efficiency is improved by increasing the area of a first light-emitting element.

Aspects of the present disclosure also provide a method of fabricating a display device in which internal quantum efficiency is improved by increasing the area of a first light-emitting element.

It should be noted that aspects of the present disclosure are not limited to the above-mentioned object, and other aspects of the present disclosure will be apparent to those skilled in the art from the following descriptions.

According to an aspect of the present disclosure, there is provided a display device including light-emitting elements arranged on a circuit substrate, extending in a thickness direction of the circuit substrate, and including a first light-emitting element configured to emit a first light, and a second light-emitting element configured to emit a second light, and having a width that is less than a width of the first light-emitting element, a common electrode layer above the light-emitting elements, and a connection electrode layer between the first light-emitting element and the common electrode layer.

The first light-emitting element may be on a different layer from the second light-emitting element.

The light-emitting elements may further include a third light-emitting element configured to emit a third light, and being on a different layer from the first light-emitting element.

The third light-emitting element may be on a same layer as the second light-emitting element.

The width of the first light-emitting element may be greater than a width of the third light-emitting element.

One or more portions of the first light-emitting element may overlap the second light-emitting element and the third light-emitting element in a plan view.

The connection electrode layer might not overlap with the second light-emitting element.

The connection electrode layer may include a same material as the common electrode layer.

A width of the connection electrode layer may be less than a width of the first light-emitting element.

The light-emitting elements may include a first semiconductor layer on the circuit substrate, an active layer on the first semiconductor layer, and a second semiconductor layer on the active layer.

The light-emitting elements may further include an electron blocking layer between the first semiconductor layer and the active layer, and a superlattice layer between the active layer and the second semiconductor layer.

The circuit substrate may further include pixel electrodes, wherein the first semiconductor layer of the light-emitting elements is connected to a respective one of the pixel electrodes.

The display device may further include a connection electrode between the first semiconductor layers of the light-emitting elements and the pixel electrodes.

A length of the connection electrode of the first light-emitting element may be less than a length of the connection electrode of the second light-emitting element.

The connection electrode layer may include a same material as the second semiconductor layer.

According to another aspect of the present disclosure, there is provided a method of fabricating a display device, the method including forming a common electrode layer on a first substrate, forming a first light-emitting element for emitting a first light, and a second light-emitting element for emitting a second light, on the common electrode layer, forming a connection electrode layer between the first light-emitting element and the second light-emitting element, and forming a third light-emitting element for emitting a third light on the connection electrode layer.

The first and second light-emitting elements may include a first semiconductor layer on a circuit substrate, an active layer on the first semiconductor layer, and a second semiconductor layer on the active layer.

The connection electrode layer may include a same material as the common electrode layer.

A width of the first light-emitting element may be greater than a width of the second light-emitting element and greater than a width of the third light-emitting element.

The first light-emitting element may overlap with the second light-emitting element and the third light-emitting element in a plan view.

The details of one or more embodiments of the subject matter described in this specification are set forth in the accompanying drawings and the description below.

According to embodiments of the present disclosure, it is possible to improve the internal quantum efficiency of a display device by increasing the area of a first light-emitting element It should be noted that aspects of the present disclosure are not limited to those described above and other aspects of the present disclosure will be apparent to those skilled in the art from the following descriptions.

BRIEF DESCRIPTION OF THE DRAWINGS

The above and other aspects of the present disclosure will become more apparent by describing in detail embodiments thereof with reference to the attached drawings, in which.

DETAILED DESCRIPTION

Figure 1:
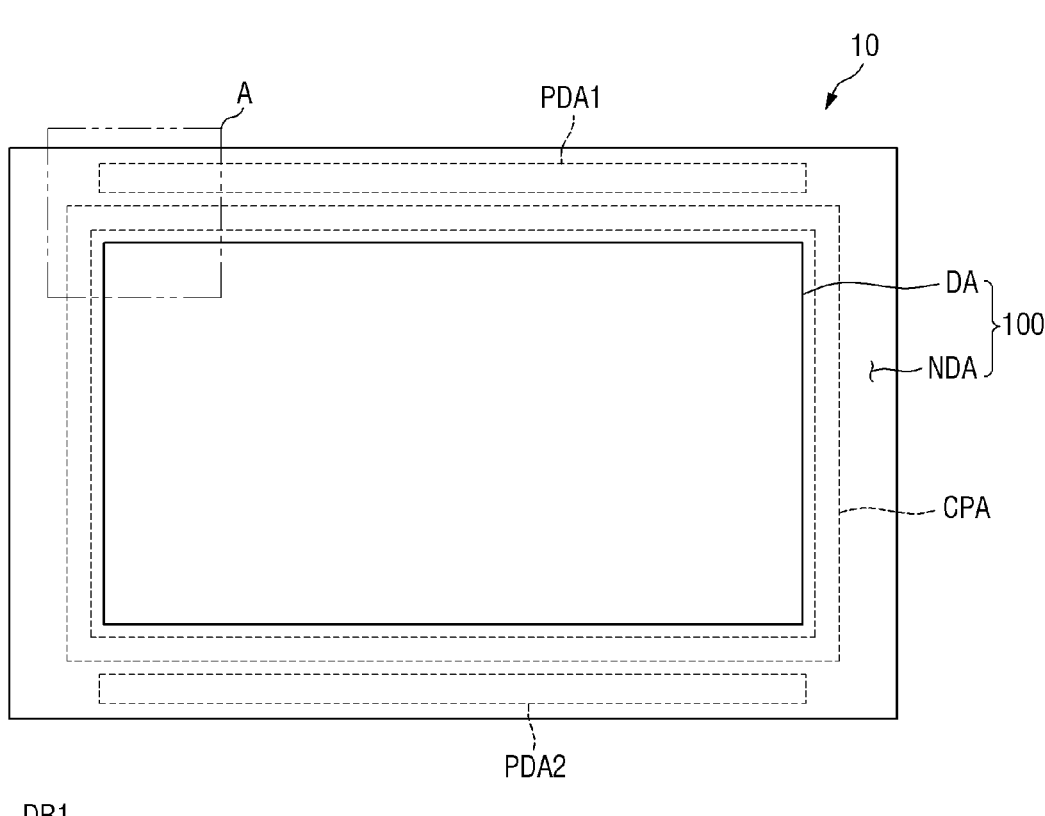
FIG. 1 is a view showing a layout of a display device according to some embodiments of the present disclosure.
Figure 1:
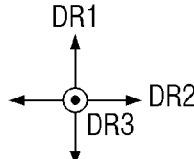

Structural and functional descriptions of embodiments of the present disclosure disclosed herein are only for illustrative purposes of the embodiments of the present disclosure. The embodiments may be embodied in many different forms without departing from the spirit and significant characteristics of the present disclosure. Therefore, the embodiments of the present disclosure are disclosed only for illustrative purposes and should not be construed as being limiting. That is, the claimed embodiments are only defined by the scope of the claims.

Aspects of some embodiments of the present disclosure and methods of accomplishing the same may be understood more readily by reference to the detailed description of embodiments and the accompanying drawings. Hereinafter, embodiments will be described in more detail with reference to the accompanying drawings. The described embodiments, however, may have various modifications and may be embodied in various different forms, and should not be construed as being limited to only the illustrated embodiments herein. Rather, these embodiments are provided as examples so that this disclosure will be thorough and complete, and will fully convey the aspects of the present disclosure to those skilled in the art, and it should be understood that the present disclosure covers all the modifications, equivalents, and replacements within the idea and technical scope of the present disclosure. Accordingly, processes, elements, and techniques that are not necessary to those having ordinary skill in the art for a complete understanding of the aspects of the present disclosure may not be described.

Unless otherwise noted, like reference numerals, characters, or combinations thereof denote like elements throughout the attached drawings and the written description, and thus, descriptions thereof will not be repeated. Further, parts that are not related to, or that are irrelevant to, the description of the embodiments might not be shown to make the description clear.

In the drawings, the relative sizes of elements, layers, and regions may be exaggerated for clarity. Additionally, the use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified.

Various embodiments are described herein with reference to sectional illustrations that are schematic illustrations of embodiments and/or intermediate structures. As such, variations from the shapes of the illustrations as a result, for example, of manufacturing techniques and/or tolerances, are to be expected. Further, specific structural or functional descriptions disclosed herein are merely illustrative for the purpose of describing embodiments according to the concept of the present disclosure. Thus, embodiments disclosed herein should not be construed as limited to the particular illustrated shapes of regions, but are to include deviations in shapes that result from, for instance, manufacturing.

For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting. Additionally, as those skilled in the art would realize, the described embodiments may be modified in various different ways, all without departing from the spirit or scope of the present disclosure.

In the detailed description, for the purposes of explanation, numerous specific details are set forth to provide a thorough understanding of various embodiments. It is apparent, however, that various embodiments may be practiced without these specific details or with one or more equivalent arrangements. In other instances, well-known structures and devices are shown in block diagram form in order to avoid unnecessarily obscuring various embodiments.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly. Similarly, when a first part is described as being arranged "on" a second part, this indicates that the first part is arranged at an upper side or a lower side of the second part without the limitation to the upper side thereof on the basis of the gravity direction.

Further, in this specification, the phrase "on a plane," or "plan view," means viewing a target portion from the top, and the phrase "on a cross-section" means viewing a cross-section formed by vertically cutting a target portion from the side.

It will be understood that when an element, layer, region, or component is referred to as being "formed on," "on," "connected to," or "coupled to" another element, layer, region, or component, it can be directly formed on, on, connected to, or coupled to the other element, layer, region, or component, or indirectly formed on, on, connected to, or coupled to the other element, layer, region, or component such that one or more intervening elements, layers, regions, or components may be present. In addition, this may collectively mean a direct or indirect coupling or connection and an integral or non-integral coupling or connection. For example, when a layer, region, or component is referred to as being "electrically connected" or "electrically coupled" to another layer, region, or component, it can be directly electrically connected or coupled to the other layer, region, and/or component or intervening layers, regions, or components may be present. However, "directly connected/directly coupled," or "directly on," refers to one component directly connecting or coupling another component, or being on another component, without an intermediate component. Meanwhile, other expressions describing relationships between components such as "between," "immediately between" or "adjacent to" and "directly adjacent to" may be construed similarly. In addition, it will also be understood that when an element or layer is referred to as being "between" two elements or layers, it can be the only element or layer between the two elements or layers, or one or more intervening elements or layers may also be present.

For the purposes of this disclosure, expressions such as "at least one of," when preceding a list of elements, modify the entire list of elements and do not modify the individual elements of the list. For example, "at least one of X, Y, and Z," "at least one of X, Y, or Z," and "at least one selected from the group consisting of X, Y, and Z" may be construed as X only, Y only, Z only, any combination of two or more of X, Y, and Z, such as, for instance, XYZ, XYY, YZ, and ZZ, or any variation thereof. Similarly, the expression such as "at least one of A and B" may include A, B, or A and B. As used herein, "or" generally means "and/or," and the term "and/or" includes any and all combinations of one or more of the associated listed items. For example, the expression such as "A and/or B" may include A, B, or A and B.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present disclosure. The description of an element as a "first" element may not require or imply the presence of a second element or other elements. The terms "first", "second", etc. may also be used herein to differentiate different categories or sets of elements. For conciseness, the terms "first", "second", etc. may represent "first-category (or first-set)", "second-category (or second-set)", etc., respectively.

In the examples, the x-axis, the y-axis, and/or the z-axis are not limited to three axes of a rectangular coordinate system, and may be interpreted in a broader sense. For example, the x-axis, the y-axis, and the z-axis may be perpendicular to one another, or may represent different directions that are not perpendicular to one another. The same applies for first, second, and/or third directions.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises," "comprising," "have," "having," "includes," and "including," when used in this specification, specify the presence of the stated features, integers, steps, operations, elements, and/or components, but do not preclude the presence or addition of one or more other features, integers, steps, operations, elements, components, and/or groups thereof.

When one or more embodiments may be implemented differently, a specific process order may be performed differently from the described order. For example, two consecutively described processes may be performed substantially at the same time or performed in an order opposite to the described order.

As used herein, the term "substantially," "about," "approximately," and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value. Further, the use of "may" when describing embodiments of the present disclosure refers to "one or more embodiments of the present disclosure."

Also, any numerical range disclosed and/or recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein, and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification such that amending to expressly recite any such subranges would comply with the requirements of 35 U.S.C. § 112(a) and 35 U.S.C. § 132(a).

Unless otherwise defined, all terms (including technical and scientific terms) used herein have the same meaning as commonly understood by one of ordinary skill in the art to which the present disclosure belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 2:
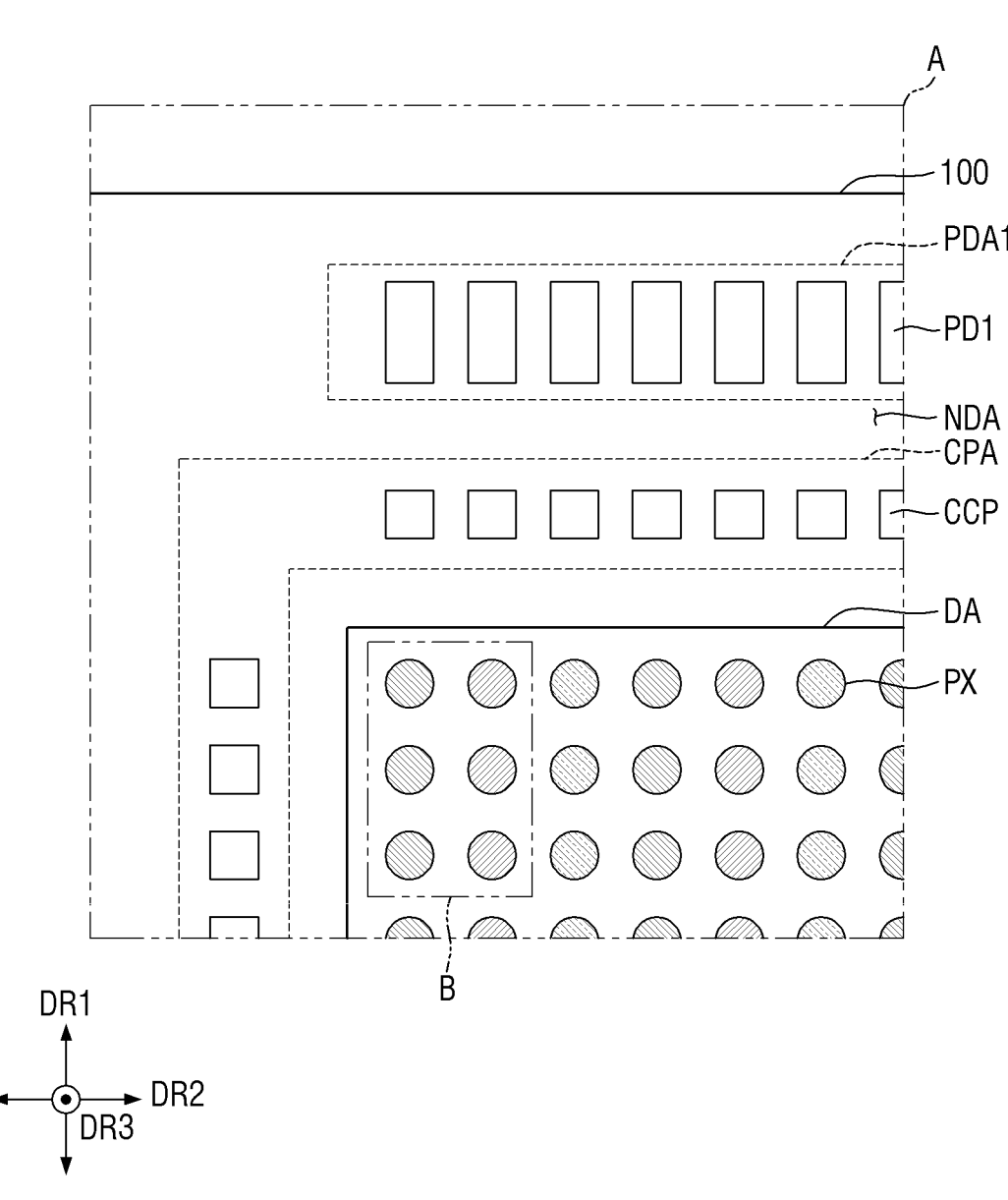
FIG. 2 is a view showing a layout of area A of FIG. 1.
Figure 3:
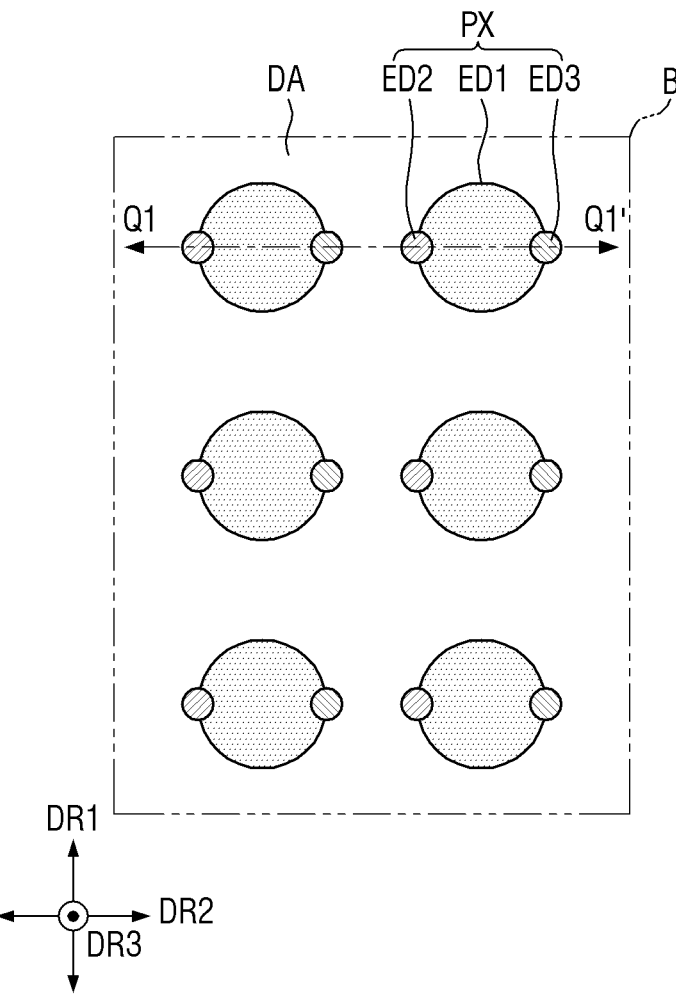
FIG. 3 is a plan view showing area B of FIG. 2 in detail.

FIG. 1 is a view showing a layout of a display device according to some embodiments of the present disclosure. FIG. 2 is a view showing a layout of area A of FIG. 1. FIG. 3 is a plan view showing area B of FIG. 2 in detail.

In the example shown in FIGS. 1 to 3, the display device according to some embodiments is a micro light-emitting diode display device including a micro light-emitting diode as a light-emitting element. It should be understood, however, that the present disclosure is not limited thereto.

In addition, in the example shown in FIGS. 1 to 3, the display device according to some embodiments is implemented as a light-emitting diode on silicon (LEDoS) microdisplay (e.g., light-emitting diodes are located on a semiconductor circuit board formed via a semiconductor process). It should be understood, however, that embodiments of the present disclosure are not limited thereto.

In FIGS. 1 to 3, a first direction DR1 indicates the vertical direction of the display panel 100, a second direction DR2 indicates the horizontal direction of the display panel 100, and a third direction DR3 indicates the thickness direction of the display panel 100. As used herein, the terms "left," "right," "upper" and "lower" sides indicate relative positions when the display panel 100 is viewed from the top. For example, the right side refers to one side in the second direction DR2, the left side refers to the opposite side in the second direction DR2, the upper side refers to one side in the first direction DR1, and the lower side refers to the opposite side in the first direction DR1. In addition, the upper portion refers to the side indicated by the arrow of the third direction DR3, while the lower portion refers to the opposite side in the third direction DR3.

Referring to FIGS. 1 to 3, a display device 10 according to some embodiments includes a display panel 100 including a display area DA and a non-display area NDA.

The display panel 100 may have a quadrangular shape having shorter sides in the first direction DR1 and longer sides in the second direction DR2 when viewed from the top. It should be understood, however, that the shape of the display panel 100 when viewed from the top is not limited thereto. It may have a polygonal, circular, oval, or irregular shape other than the rectangular shape when viewed from the top.

In the display area DPA, images can be displayed. In the non-display area NDA, images may not be displayed. The shape of the display area DA may follow the shape of the display panel 100 when viewed from the top. In the example shown in FIG. 1, the display area DA has a rectangular shape when viewed from the top. The display area DA may be located at the central area of the display panel 100. The non-display area NDA may be located around the display area DA. The non-display area NDA may surround the display area DA.

The display area DA of the display panel 100 may include a plurality of pixels PX. Each of the pixels PX may be defined as a minimum light-emitting unit for displaying light (e.g., white light).

Each of the pixels PX may include a plurality of emission areas, from each of which light exits. Light-emitting diodes ED1, ED2, and ED3 may be located in each of the emission areas. Although each of the plurality of pixels PX includes three emission areas according to some embodiments of the present disclosure, the present disclosure is not limited thereto. For example, each of the plurality of pixels PX may include four emission areas. In addition, it may be interpreted that the pixels PX include three light-emitting diodes ED1, ED2, and ED3.

Each of the plurality of emission areas may include a first light-emitting diode ED1 for emitting a first light, a second light-emitting diode ED2 for emitting a second light, and a third light-emitting diode ED3 for emitting a third light. Although the light-emitting diodes ED1, ED2, and ED3 have a circular shape when viewed from the top in the example shown, embodiments of the present disclosure are not limited thereto. For example, the light-emitting diodes ED1, ED2, and ED3 may have a polygonal, oval, or irregular shape other than a circular shape.

Each of the first emission areas refers to an area for emitting the first light. Each of the first emission areas may output the first light emitted from the first light-emitting diode ED1 as it is. The first light may be light in a red wavelength range. The red wavelength range may be approximately 600 nm to approximately 750 nm, but embodiments of the present disclosure are not limited thereto.

Each of the second emission areas refers to an area emitting the second light. Each of the second emission areas may output the second light emitted from the second light-emitting diode ED2. The second light may be light in a green wavelength range. The green wavelength range may be approximately 480 nm to approximately 560 nm, but embodiments of the present disclosure are not limited thereto.

Each of the third emission areas refers to an area emitting the third light. Each of the third emission areas may output the third light emitted from the third light-emitting diode ED3. The third light may be light in a blue wavelength range. The blue wavelength range may be approximately 370 nm to approximately 460 nm, but embodiments of the present disclosure are not limited thereto.

As shown in FIG. 3, the pixels PX may be arranged in the first direction DR1 and the second direction DR2. The width of the first light-emitting diode ED1 included in the pixel PX may be greater than the width of the second light-emitting diode ED2 and the width of the third light-emitting diode ED3. The first light-emitting diode ED1 may overlap the second light-emitting diode ED2 and the third light-emitting diode ED3 when viewed from the top. According to some embodiments of the present disclosure, the first light-emitting diode ED1 may overlap a part of the second light-emitting diode ED2 and a part of the third light-emitting diode ED3 when viewed from the top. In a single pixel PX, the second light-emitting diode ED2 may be located on the left side of the center of the first light-emitting diode ED1, while the third light-emitting diode ED3 may be located on the right side thereof in the second direction DR2. It should be understood, however, that the present disclosure is not limited thereto.

The non-display area NDA may include a first pad area PDA1 and a second pad area PDA2.

The first pad area PDA1 may be located in the non-display area NDA. The first pad area PDA1 may be located at the upper portion of the display panel 100. The first pad area PDA1 may include first pads PD1 connected to an external circuit board.

The second pad area PDA2 may be located in the non-display area NDA. The second pad area PDA2 may include second pads connected to an external circuit board. The second pad area PDA2 may be omitted in some embodiments.

In addition, the non-display area NDA may further include a common electrode connection area CPA surrounding the display area DA.

The common electrode connection area CPA may be located in the non-display area NDA, and may be located between the first pad area PDA1 and the display area DA, and between the second pad area PDA2 and the display area DA. In addition, the common electrode connection area CPA may be located on one side and on the opposite side of the display area DA in the first direction DR1, and may be located on one side and on the opposite side in the second direction DR2. The common electrode connection area CPA may include a plurality of connection electrodes CCP to be connected to the semiconductor circuit board.

Although FIG. 1 shows that the common electrode connection area CPA completely surrounds the display area DA, some embodiments of the present specification is not limited thereto. For example, the common electrode connection area CPA may be located on one side, both sides, or at least three sides of the display area DA.

Figure 4:
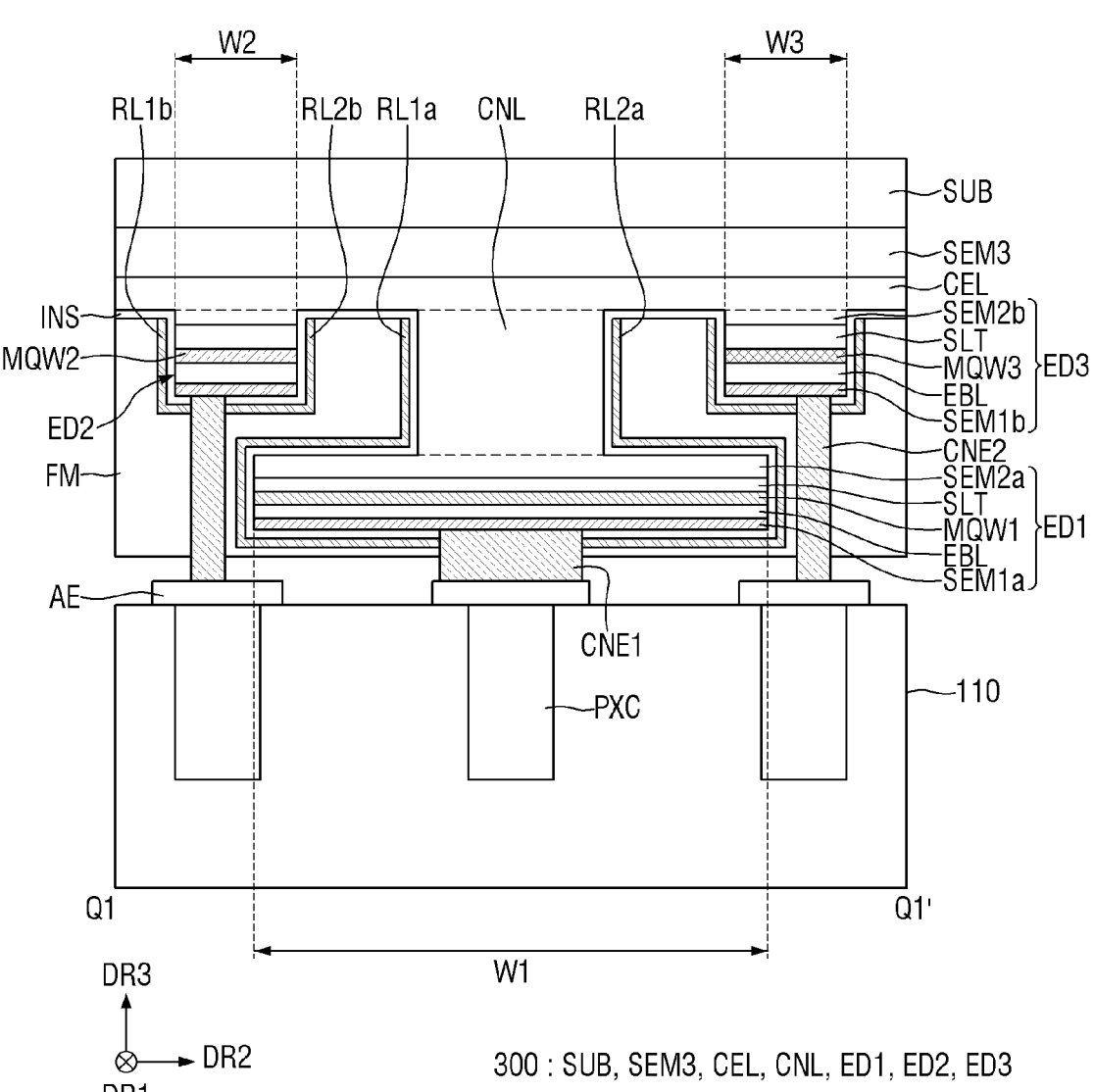
FIG. 4 is a cross-sectional view showing an example of a display panel, taken along the line Q1-Q1' of FIG. 3.

FIG. 4 is a cross-sectional view showing an example of a display panel, taken along the line Q1-Q1' of FIG. 3.

Referring to FIG. 4 in conjunction with FIGS. 1 to 3, in the display device 10 according to some embodiments, the display panel 100 (see FIG. 1) may include a circuit substrate and a display substrate 300. The circuit substrate board may include a first substrate 110 and pixel circuits PXC, and the display substrate 300 may include light-emitting diodes ED1, ED2, and ED3.

The first substrate 110 may be a semiconductor circuit board. The first substrate 110 is a silicon wafer substrate formed using a semiconductor process, and may include a plurality of pixel circuits PXC. Each of the pixel circuits PXC may be formed via a process of forming a semiconductor circuit on a silicon wafer. Each of the plurality of pixel circuits PXC may include at least one transistor and at least one capacitor formed via a semiconductor process. For example, the plurality of pixel circuits PXC may include CMOS circuit.

The plurality of pixel circuits PXC may be located in the display area DA and the non-display area NDA. Among the plurality of pixel circuits PXC, the pixel circuits PXC located in the display area DA may be electrically connected to the pixel electrodes AE, respectively. The plurality of pixel circuits PXC located in the display area DA may be associated with the plurality of pixel electrodes AE, respectively. They may overlap the light-emitting diodes ED1, ED2, and ED3 located in the display area DA in the third direction DR3, which is the thickness direction.

The plurality of light-emitting diodes ED1, ED2, and ED3 of the display substrate 300 may be located in the display area DA of the display substrate 300 and may be associated with the plurality of pixel electrodes AE of the first substrate 110, respectively.

The light-emitting diodes ED1, ED2, and ED3 may be inorganic light-emitting diodes. The light-emitting diodes ED1, ED2, and ED3 may include semiconductor layers and active layers MQW1, MQW2, and MQW3. The light-emitting diodes ED1, ED2, and ED3 may be electrically connected to the pixel circuits PXC of the first substrate 110 to emit light from the active layers MQW1, MQW2, and MQW3.

The light-emitting diodes ED1, ED2, and ED3 may have a shape extended in the third direction DR3. The length of the light-emitting diodes ED1, ED2, and ED3 in the third direction DR3 may be larger than the length in the horizontal direction. For example, the length of the light-emitting diodes ED1, ED2, and ED3 in the third direction DR3 may be approximately 1 μm to approximately 5 μm. The light-emitting diodes ED1, ED2, and ED3 may have a cylindrical shape, a disk shape, or a rod shape having the width longer than the height. It should be understood, however, that the present disclosure is not limited thereto. The light-emitting diodes ED1, ED2, and ED3 may have a shape of a rod, wire, tube, etc., a polygonal prism such as a cube, a cuboid and a hexagonal prism, or may be extended in a direction with partially inclined outer surface.

The first light-emitting diode ED1 may include a first semiconductor layer SEM1a, an electron blocking layer EBL, an active layer MQW1, a superlattice layer SLT, and a second semiconductor layer SEM2a. The first semiconductor layer SEM1a, the electron blocking layer EBL, the active layer MQW1, the superlattice layer SLT and the second semiconductor layer SEM2a may be stacked on one another in this order in the third direction DR3.

The second light-emitting diodes ED2 and/or the third light-emitting diodes ED3 may include a first semiconductor layer SEM1b, an electron blocking layer EBL, active layers MQW2 or MQW3, a superlattice layer SLT, and a second semiconductor layer SEM2b. The first semiconductor layer SEM1b, the electron blocking layer EBL, the active layers MQW2 or MQW3, the superlattice layer SLT and the second semiconductor layer SEM2b may be stacked on one another in this order in the third direction DR3.

The material of the first semiconductor layer SEM1a of the first light-emitting diode ED1 may be the same as the material of the first semiconductor layer SEM1b of the second light-emitting diode ED2 and/or the third light-emitting diode ED3. The material of the second semiconductor layer SEM2a of the first light-emitting diode ED1 may be the same as the material of the second semiconductor layer SEM2b of the second light-emitting diode ED2 and/or the third light-emitting diode ED3.

The first semiconductor layer SEM1a and SEM1b may be a p-type semiconductor, and may include a semiconductor material having the following chemical formula: $Al_xGa_yIn_{1-x-y}N$ ($0 \leq x \leq 1$, $0 \leq y \leq 1$ and $0 \leq x+y \leq 1$). For example, it may be at least one of p-type doped AlGaInN, GaN, AlGaN, InGaN, AlN, and InN. The first semiconductor layer SEM1 may be doped with a p-type dopant, and the p-type dopant may be Mg, Zn, Ca, Ba, etc. For example, the first semiconductor layer SEM1 may be p-GaN doped with p-type Mg.

The electron blocking layer EBL may be located on the first semiconductor layers SEM1a and SEM1b. The electron blocking layer EBL can reduce or prevent electrons flowing into the active layers MQW1, MQW2, and MQW3 that fail to recombine with holes in the active layers MQW1, MQW2, and MQW3 and that are injected into other layers. For example, the electron blocking layer EBL may be p-AlGaN doped with p-type Mg. The thickness of the electron blocking layer may be in a range of about 10 nm to about 50 nm, but the present disclosure is not limited thereto. In some embodiments, the electron blocking layer EBL may be omitted.

The active layers MQW1, MQW2, and MQW3 may be located on the electron blocking layer EBL. The active layer MQW1, MQW2, and MQW3 can emit light as electrons and holes are recombined therein in response to an emission signal applied through the first semiconductor layer SEM1 and the second semiconductor layer SEM2. The active layers MQW1, MQW2, and MQW3 may include a material having a single or multiple quantum well structure. When the active layers MQW1, MQW2, and MQW3 include a material having the multiple quantum well structure, well layers and barrier layers may be alternately stacked on one another in the structure. The well layers may be made of InGaN, and the barrier layers may be made of GaN or AlGaN, but the present disclosure is not limited thereto. For example, each of the active layers MQW1, MQW2, and MQW3 may have a structure in which a semiconductor material having a large band gap energy and a semiconductor material having a small band gap energy are alternately stacked on one another, and may include other Group III to Group V semiconductor materials depending on the wavelength range of the emitted light.

The superlattice layer SLT is located on the active layers MQW1, MQW2, and MQW3. The superlattice layer SLT may relieve stress due to a difference in lattice constants between the second semiconductor layers SEM2$a$ and SEM2$b$ and the active layers MQW1, MQW2, and MQW3. For example, the superlattice layer SLT may be made of InGaN or GaN. The thickness of the superlattice layer SLT may be approximately 50 nm to approximately 200 nm. It should be noted that the superlattice layer SLT may be omitted in some embodiments.

The second semiconductor layers SEM2$a$ and SEM2$b$ may be located on the superlattice layer SLT. The second semiconductor layers SEM2$a$ and SEM2$b$ may be n-type semiconductors. The second semiconductor layers SEM2$a$ and SEM2$b$ may include a semiconductor material having the chemical formula $Al_xGa_yIn_{1-x-y}N$ ($0 \leq x \leq 1$, $0 \leq y \leq 1$, $0 \leq x+y \leq 1$). For example, it may be at least one of n-type doped AlGaInN, GaN, AlGaN, InGaN, AlN, and InN. The second semiconductor layer SEM2 may be doped with an n-type dopant, and the n-type dopant may be Si, Ge, Sn, etc. For example, the second semiconductor layer SEM2 may be n-GaN doped with n-type Si. The thickness of the second semiconductor layer SEM2 may range, but is not limited to, from about 2 μm to about 4 μm.

According to some embodiments, some of the light-emitting diodes ED1, ED2, and ED3 of the display device 10 may include different active layers MQW1, MQW2, and MQW3 to emit light of different colors. For example, the first light-emitting diode ED1 may include a first active layer MQW1, the second light-emitting diode ED2 may include a second active layer MQW2, and the third light-emitting diode ED3 may include a third active layer MQW3. The first light-emitting diode ED1 may emit red light of a first color, the second light-emitting diode ED2 may emit green light of a second color, and the third light-emitting diode ED3 may emit blue light of a third color. The first light-emitting diode ED1, the second light-emitting diode ED2, and the third light-emitting diode ED3 may have different concentrations of dopants doped in the first semiconductor layers SEM1$a$ and SEM1$b$, the electron blocking layer EBL, the active layers MQW1, MQW2, and MQW3, the superlattice layer SLT, and the second semiconductor layers SEM2$a$ and SEM2$b$, or may have different values of x and y in the formula: $Al_xGa_yIn_{1-x-y}N$ ($0 \leq x \leq 1$, $0 \leq y \leq 1$ and $0 \leq x+y \leq 1$). The first to third light-emitting diodes ED1, ED2, and ED3 may have substantially the same structure and material, but may include different component ratios at the semiconductor layers to emit lights of different colors.

For example, the first active layer MQW1 may emit light as electrons holes are recombined therein in response to an electrical signal applied through the first semiconductor layer SEM1$a$ and the second semiconductor layer SEM2$a$. The first active layer MQW1 may emit first light having a main peak wavelength in the range of approximately 600 nm to approximately 750 nm (e.g., light of the red wavelength range).

The second active layer MQW2 may emit light as electrons and holes are combined therein in response to an electrical signal applied through the first semiconductor layer SEM1$b$ and the second semiconductor layer SEM2$b$. The second active layer MQW2 may emit second light having a main peak wavelength in the range of approximately 480 nm to approximately 560 nm (e.g., light of the green wavelength range).

The third active layer MQW3 may emit light as electrons and holes are combined therein in response to an electrical signal applied through the first semiconductor layer SEM1$b$ and the second semiconductor layer SEM2$b$. The third active layer MQW3 may emit third light having a main peak wavelength in the range of approximately 370 nm to approximately 460 nm (e.g., light of the blue wavelength range).

In some embodiments in which each of the first active layer MQW1, the second active layer MQW2, and the third active layer MQW3 contains InGaN, they may emit lights of different colors depending on the content of indium (In). For example, as the content of indium (In) increases, the wavelength range of light output from the first to third active layers MQW1, MQW2, and MQW3 may move to the red wavelength range, and as the content of indium (In) decreases, the wavelength range of the output light may move to the blue wavelength range. The content of indium (In) in the first active layer MQW1 may be higher than the content of indium (In) in the second active layer MQW2, and the content of indium (In) in the second active layer MQW2 may be higher than the content of indium (In) in the third active layer MQW3. For example, the content of indium (In) in the third active layer MQW3 may be about 15%, the content of indium (In) in the second active layer MQW2 may be about 25%, and the content of indium (In) in the first active layer MQW1 may be about 35% or more.

Similarly, in some embodiments where the first semiconductor layers SEM1$a$ and SEM1$b$, the second semiconductor layers SEM2$a$ and SEM2$b$, the superlattice layer SLT, and the electron blocking layer EBL of the first to third light-emitting diodes ED1, ED2, and ED3 contain InGaN, they may have different contents of indium (In). Like the first to third active layers MQW1, MQW2, and MQW3, the first semiconductor layers SEM1$a$ and SEM1$b$, the second semiconductor layers SEM2$a$ and SEM2$b$, the superlattice layer SLT and the electron blocking layer of the first to third light-emitting diodes ED1, ED2, and ED3 may have a higher or lower content of indium (In) than that of the other light-emitting diodes ED1, ED2, and ED3.

An insulating layer INS may surround the side surfaces of the light-emitting diodes ED1, ED2, and ED3, and a part of the insulating layer INS may be located on a common electrode layer CEL. The insulating layer INS may be located entirely on the surface of the common electrode layer CEL, which faces the first substrate 110, and may partially cover the surfaces of the first semiconductor layers SEM1$a$ and SEM1$b$ in addition to the side surfaces of the light-emitting diodes ED1, ED2, and ED3. Connection electrodes CNE1 and CNE2 may be located on parts of the surfaces of the light-emitting diodes ED1, ED2, and ED3 where the insulating layer INS is not located. Furthermore, the insulating layer INS may be located on the side surfaces of a connection electrode layer CNL and one surface of the second semiconductor layer SEM2a (the surface facing the common electrode layer CEL) as well. The second connection electrode CNE2 may connect the first semiconductor layer SEM1b with the pixel electrode AE, and the first connection electrode CNE1 may connect the first semiconductor layer SEM1a with the pixel electrode AE.

The insulating layer INS can protect the plurality of light-emitting diodes ED1, ED2, and ED3, and can insulate them from other layers. The insulating layer INS may include an inorganic insulating material, such as silicon oxide (SiOx), silicon nitride (SiNx), silicon oxynitride (Si-OxNy), aluminum oxide (AlOy), and aluminum nitride (AlNx).

The first reflective layers RL1a and RL1b and the second reflective layers RL2a and RL2b may be located on the insulating layer INS, and may surround the side surfaces of the light-emitting diodes ED1, ED2, and ED3. The first reflective layers RL1a and RL1b and the second reflective layers RL2a and RL2b might not be formed on parts of the insulating layer INS between the light-emitting diodes ED1, ED2, and ED3 where the common electrode layer CEL is located. In the example shown in FIG. 4, the first reflective layers RL1a and RL1b may be located on the left side (for example, the other side) of the light-emitting diodes ED1, ED2, and ED3, and the second reflective layers RL2a and RL2b may be located on the right side (for example, one side) of the light-emitting diodes ED1, ED2, and ED3. The reflective layers RL1a, RL1b, RL2a, and RL2b may be located on the side surfaces of the connection electrode layer CNL as well.

Because the connection electrodes CNE1 and CNE2 directly connect the first semiconductor layers SEM1a and SEM1b with the pixel electrodes AE, the reflective layers RL1a, RL1b, RL2a, and RL2b and the insulating layer INS may be in contact with the side surfaces of the connection electrodes CNE1 and CNE2. The reflective layers RL1a, RL1b, RL2a, and RL2b may include a metal material having high reflectance, such as aluminum (Al).

The connection electrodes CNE1 and CNE2 may be located between the light-emitting diodes ED1, ED2, and ED3 and the first substrate 110. The connection electrodes CNE1 and CNE2 may include the first connection electrode CNE1 located between the first light-emitting diode ED1 and the pixel electrode AE, and the second connection electrode CNE2 located between the second light-emitting diode ED2 and/or the third light-emitting diode ED3 and the pixel electrode AE.

The first connection electrodes CNE1 and the second connection electrodes CNE2 may be located in line with the light-emitting diodes ED1, ED2, and ED3 and the pixel electrodes AE in the display area DA. The first connection electrodes CNE1 may be located on the surfaces of the first semiconductor layers SEM1a of the first light-emitting diodes ED1, while the second connection electrodes CNE2 may be located on the surfaces of the first semiconductor layers SEM1b of the second light-emitting diodes ED2 and/or the third light-emitting diodes ED3.

The connection electrodes CNE1 and CNE2 may be electrically connected to the pixel electrode AE to transmit emission signals applied to the pixel electrodes AE to the light-emitting diodes ED1, ED2, and ED3. The connection electrodes CNE1 and CNE2 may be ohmic connection electrodes. It is, however, to be understood that the present disclosure is not limited thereto. The connection electrodes CNE1 and CNE2 may be Schottky connection electrodes. The width of the connection electrodes CNE1 and CNE2 may be less than the width of the light-emitting diodes ED1, ED2, and ED3. The connection electrodes CNE1 and CNE2 may be located on (e.g., may contact) only parts of the surfaces of the first semiconductor layers SEM1a and SEM1b, and the insulating layer INS may be located on (e.g., may contact) the other part.

In some embodiments, a sub-connection electrode may be further located between the connection electrodes CNE1 and CNE2 and the first semiconductor layers SEM1a and SEM1b. When the light-emitting diodes ED1, ED2, and ED3 are electrically connected to the connection electrodes CNE1 and CNE2, the sub-connection electrode can reduce the resistance by contact between the light-emitting diodes ED1, ED2, and ED3 and the connection electrodes CNE1 and CNE2.

The connection electrodes CNE1 and CNE2 may be located directly on the pixel electrodes AE and may be in contact with them. The connection electrodes CNE1 and CNE2 may work as bonding metals for bonding the pixel electrodes AE with the light-emitting diodes ED1, ED2, and ED3 during the fabricating process. The connection electrodes CNE1 and CNE2 may include a material that can be electrically connected to the pixel electrodes AE and the light-emitting diodes ED1, ED2, and ED3. For example, the connection electrodes CNE1 and CNE2 may include at least one of gold (Au), copper (Cu), aluminum (Al), and tin (Sn), or may include a transparent conductive oxide such as indium tin oxide (ITO) and indium zinc oxide (IZO). Alternatively, the connection electrodes CNE1 and CNE2 may include a first layer including one of gold (Au), copper (Cu), aluminum (Al), and tin (Sn), a second layer including another one of gold (Au), copper (Cu), aluminum (Al), and tin (Sn).

The display substrate 300 may include the common electrode layer CEL electrically connected to the second semiconductor layers SEM2a and the SEM2b of the light-emitting diodes ED1, ED2, and ED3 as a single common layer. The common electrode layer CEL may be located throughout the entire surface of the display substrate 300. The common electrode layer CEL may include the same material as the second semiconductor layers SEM2a and SEM2b. The common electrode layer CEL and the second semiconductor layer SEM2b may be integrally formed. The connection electrode layer CNL may be further located between the common electrode layer CEL and the second semiconductor layer SEM2a. The width of the connection electrode layer CNL may be less than the width of the second semiconductor layer SEM2a or the width of the first light-emitting diode ED1. The connection electrode layer CNL may include the same material as the common electrode layer CEL. The connection electrode layer CNL may be formed integrally with the common electrode layer CEL and the second semiconductor layer SEM2a. According to some embodiments, the connection electrode layer CNL may not overlap the second light-emitting diode ED2 and the third light-emitting diode ED3. For example, the first light-emitting diode ED1 is spaced apart from the common electrode layer CEL with the connection electrode layer CNL interposed therebetween, and the second light-emitting diode ED2 and/or the third light-emitting diode ED3 are in direct contact with the common electrode layer CEL, and thus the first light-emitting diode ED1 is located on a different layer from the second light-emitting diode ED2 and the third light-emitting diode ED3. The separation distance between the first light-emitting diode ED1 and the common electrode layer CEL in the thickness direction may be greater than the separation distance between the second light-emitting diode ED2 and the common electrode layer CEL in the thickness direction. In addition, the separation distance between the first light-emitting diode ED1 and the pixel electrode AE in the thickness direction may be less than the separation distance between the second light-emitting diode ED2 and the pixel electrode AE in the thickness direction. Accordingly, the length of the first connection electrode CNE1 in the thickness direction may be less than the length of the second connection electrode CNE2 in the thickness direction.

A third semiconductor layer SEM3 is located on the common electrode layer CEL. The third semiconductor layer SEM3 may be an undoped semiconductor. The third semiconductor layer SEM3 may include the same material as the second semiconductors SEM2a and SEM2b, but might not be doped with an n-type or p-type dopant. In some embodiments, the third semiconductor layer SEM3 may be, but is not limited to, at least one of undoped InAlGaN, GaN, AlGaN, InGaN, AlN, and InN.

The display substrate 300 may include a second substrate SUB facing the first substrate 110. The second substrate SUB may be a transparent substrate. The second substrate SUB may include a sapphire substrate ($Al_2O_3$) or a transparent substrate such as glass. It is, however, to be understood that the present disclosure is not limited thereto. The support substrate may be formed as a conductive substrate such as GaN, SiC, ZnO, Si, GaP, and GaAs. According to some embodiments of the present disclosure, the second substrate SUB may be a sapphire substrate ($Al_2O_3$).

The filling layer FM may be located between the first substrate 110 and the second substrate SUB. The filling layer FM may be used to fill the space between the second substrate SUB and the first substrate 110 formed by the level differences of the first to third light-emitting diodes ED1, ED2, and ED3. The filling layer FM material(s) may include, but are not limited to, an insulating material such as silicon oxide (SiOx), silicon nitride (SiNx), and silicon oxynitride (SiOxNy).

Incidentally, as in some embodiments, when the active layers MQW1, MQW2, and MQW3 of the light-emitting diodes ED1, ED2, and ED3 are made of InGaN, the internal quantum efficiency (IQE) may decrease at a high current density when the first active layer MQW1 emits red light, which is the first light. Accordingly, to lower the current density in the first active layer MQW1, it may be suitable that the area of the first active layer MQW1 is larger than the areas of the second and third active layers MQW2 and MQW3. If the first to third light-emitting diodes are located on the same layer, it may be difficult to increase the area of the first active layer of the first light-emitting diodes in the given area. In contrast, according to some embodiments of the present disclosure, the layer on which the first light-emitting diodes ED1 including the first active layer MQW1 are located is different from the layer on which the second light-emitting diodes ED2 and the third light-emitting diodes ED3 are located, and thus it may not be difficult to increase the area (or width) of the first active layer MQW1.

As in some embodiments, the layer on which the first light-emitting diodes ED1 including the first active layer MQW1 are located is different from the layer on which the second light-emitting diodes ED2 and/or the third light-emitting diodes ED3 are located, and thus the width W1 of the first light-emitting diodes ED1 can be larger than the widths W2 and W3 of the second light-emitting diodes ED2 and/or the third light-emitting diodes ED3 by utilizing the additional area, it is possible to lower the current density of the first active layer MQW1. As a result, it is possible to prevent a decrease in the internal quantum efficiency (IQE).

Hereinafter, processing operations of fabricating the display device 10 will be described with reference to other drawings.

Figure 5:
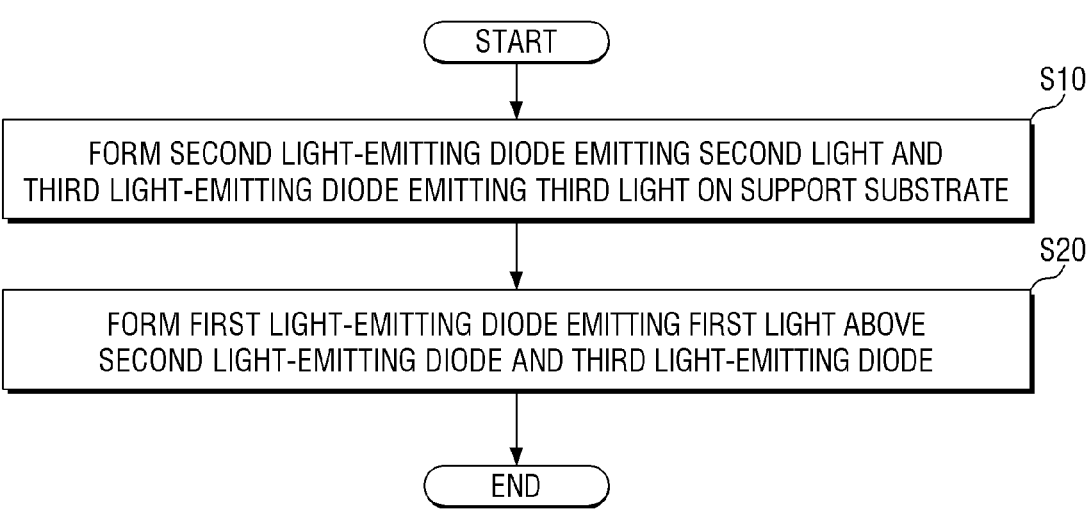
FIG. 5 is a flowchart for illustrating a method for fabricating a display device according to some embodiments of the present disclosure.

FIG. 5 is a flowchart for illustrating a method for fabricating a display device according to some embodiments of the present disclosure. FIGS. 6 to 20 are cross-sectional views showing processing operations of a method of fabricating a display device according to some embodiments of the present disclosure.

Referring to FIG. 5, the method of fabricating the display device 10 according to some embodiments of the present disclosure may include forming a second light-emitting diode for emitting a second light and a third light-emitting diode for emitting a third light on a support substrate (S10), and forming a first light-emitting diode for emitting a first light above the second light-emitting diode and the third light-emitting diode (S20). The support substrate of the flowchart of FIG. 5 may be identical to the second substrate SUB of FIG. 4.

Hereinafter, a method of fabricating a display device 10 according to some embodiments will be described in more detail with reference to FIGS. 5 to 20.

Figure 6:
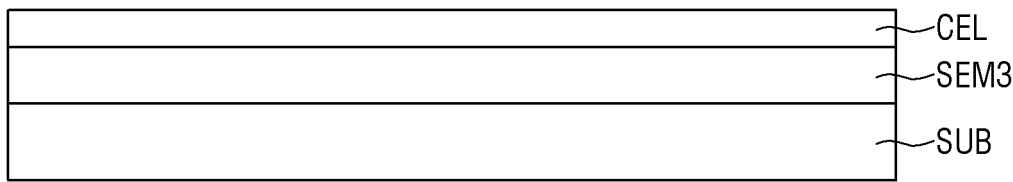
FIGS. 6 to 20 are cross-sectional views showing processing operations of a method of fabricating a display device according to some embodiments of the present disclosure.

Initially, referring to FIGS. 5 and 6, a third semiconductor layer SEM3 is formed on a second substrate SUB, and a common electrode layer CEL is formed on the third semiconductor layer SEM3.

The third semiconductor layer SEM3 may be an undoped semiconductor. The third semiconductor layer SEM3 may include the same material as the second semiconductors SEM2a and SEM2b, but might not be doped with an n-type or p-type dopant. In some embodiments, the third semiconductor layer SEM3 may be, but is not limited to, at least one of undoped InAlGaN, GaN, AlGaN, InGaN, AlN, and InN.

The common electrode layer CEL may include the same material as the second semiconductor layers SEM2a and SEM2b described above with reference to FIG. 4.

The common electrode layer CEL may be formed by epitaxial growth. The epitaxial growth may be carried out by electron beam deposition, physical vapor deposition (PVD), chemical vapor deposition (CVD), plasma laser deposition (PLD), dual-type thermal evaporation, sputtering, metal-organic chemical vapor deposition (MOCVD), etc. For example, the epitaxial growth may be carried out by, but is not limited to, metal-organic chemical vapor deposition (MOCVD). The connection electrode layer CNL and the first semiconductor layers SEM1a and SEM1b, which will be described later, may also be formed by epitaxial growth.

Figure 7:
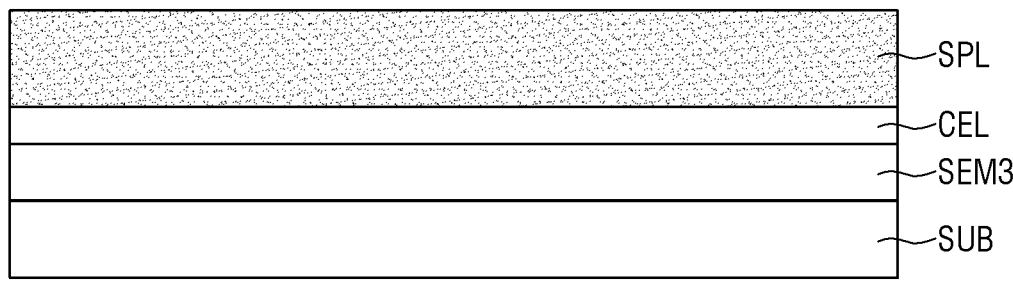

Subsequently, referring to FIG. 7, a support layer SPL is formed on the common electrode layer CEL. The support layer SPL may be located entirely on the common electrode layer CEL. The support layer SPL may include an insulating material such as silicon oxide (SiOx), silicon nitride (SiNx) and silicon oxynitride (SiOxNy), and may work as a mask for a process for forming light-emitting diodes ED1, ED2, and ED3.

Figure 8:
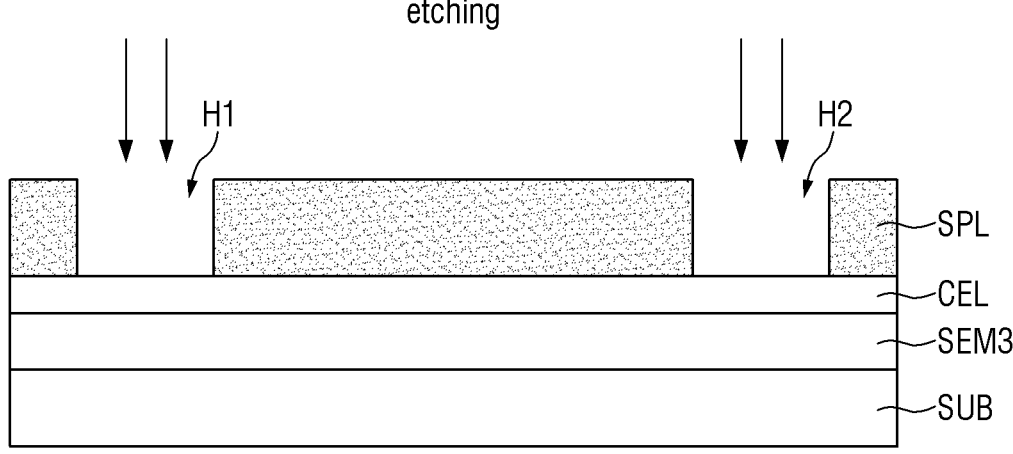

Subsequently, referring to FIG. 8, holes H1 and H2 penetrating through the support layer SPL are formed. Second light-emitting diodes ED2 and third light-emitting diodes ED3 are later formed in the holes H1 and H2, respectively. The holes H1 and H2 are formed by etching.

Figure 9:
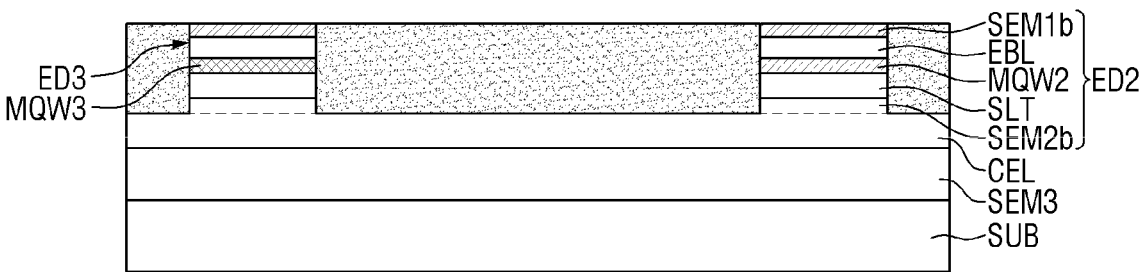

Subsequently, referring to FIGS. 5 and 9, the second light-emitting diodes ED2 and the third light-emitting diodes ED3 are formed in the plurality of holes H1 and H2 (S10). The structure of the second light-emitting diodes ED2 and the third light-emitting diodes ED3 have been described above with reference to FIG. 4. Therefore, redundant descriptions thereof will be omitted.

Figure 10:
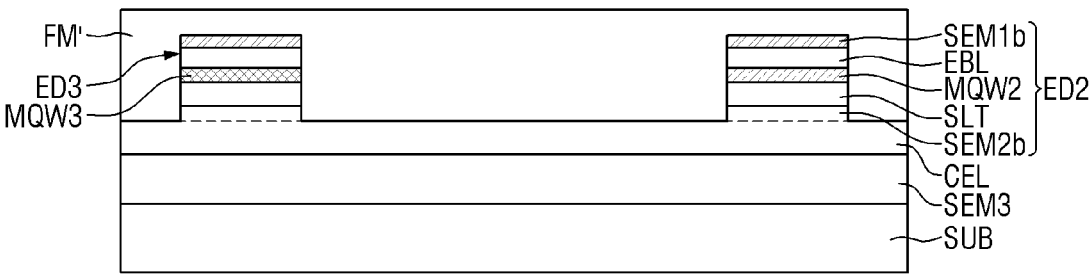

Subsequently, referring to FIG. 10, after removing the support layer SPL, a filling layer FM' is formed, which is used to fill space over the upper surfaces and between the side surfaces of the second light-emitting diodes ED2 and the third light-emitting diodes ED3. The filling layer FM' is used to fill the space between the first light-emitting diodes ED2 and ED3, and an area over the surfaces or the upper surfaces (which is depicted as the lower surfaces in FIG. 4, as compared to the upper surfaces in FIG. 10) of the second light-emitting diodes ED2 and/or the third light-emitting diode ED3, to provide a flat surface. The filling layer FM' material(s) may include, but are not limited to, an insulating material such as silicon oxide (SiOx), silicon nitride (SiNx), and silicon oxynitride (SiOxNy).

Figure 11:
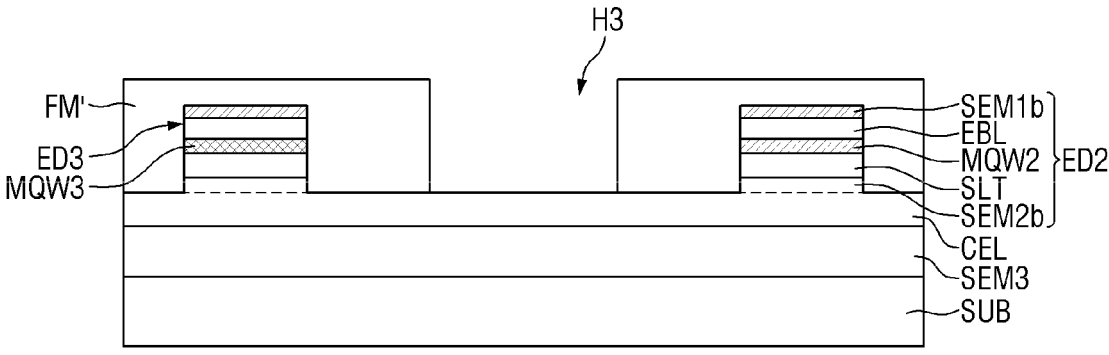

Subsequently, referring to FIG. 11, a hole H3 penetrating through the filling layer FM' is formed. A first light-emitting diode ED1 is formed in the hole H3. The hole H3 is formed by etching. For example, the support layer SPL (see FIG. 7) is formed entirely on the filling layer FM', and then an additional hole is formed in line with a location of the support layer SPL where the hole H3 is to be formed. Subsequently, the hole H3 may be formed by etching.

Figure 12:
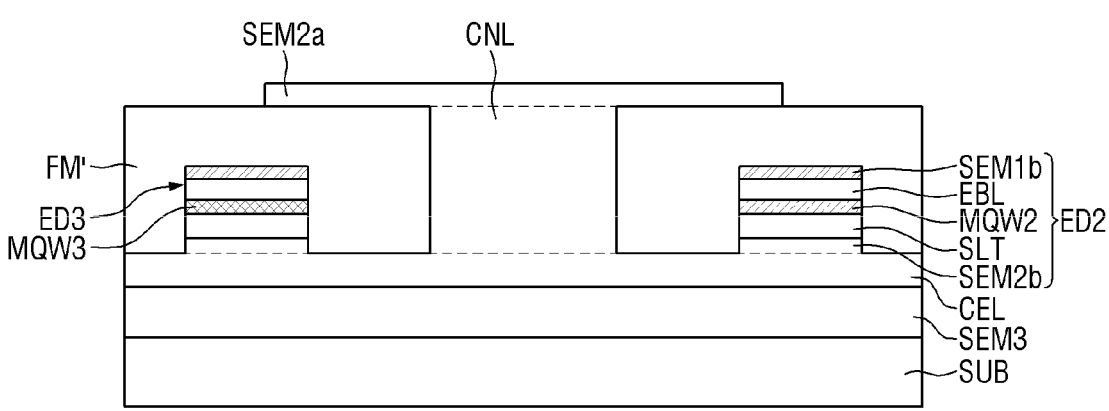

Subsequently, referring to FIG. 12, the connection electrode layer CNL and the second semiconductor layer SEM2*a* are formed from the upper surface (depicted as the lower surface in FIG. 4) of the common electrode layer CEL. The connection electrode layer CNL and the second semiconductor layer SEM2*a* may be formed by epitaxial growth, as described above. The epitaxial growth may be carried out by electron beam deposition, physical vapor deposition (PVD), chemical vapor deposition (CVD), plasma laser deposition (PLD), dual-type thermal evaporation, sputtering, metal-organic chemical vapor deposition (MOCVD), etc. For example, the epitaxial growth may be carried out by, but is not limited to, metal-organic chemical vapor deposition (MOCVD). The connection electrode layer CNL and the second semiconductor layer SEM2*a* may include the same material as the common electrode layer CEL.

Figure 13:
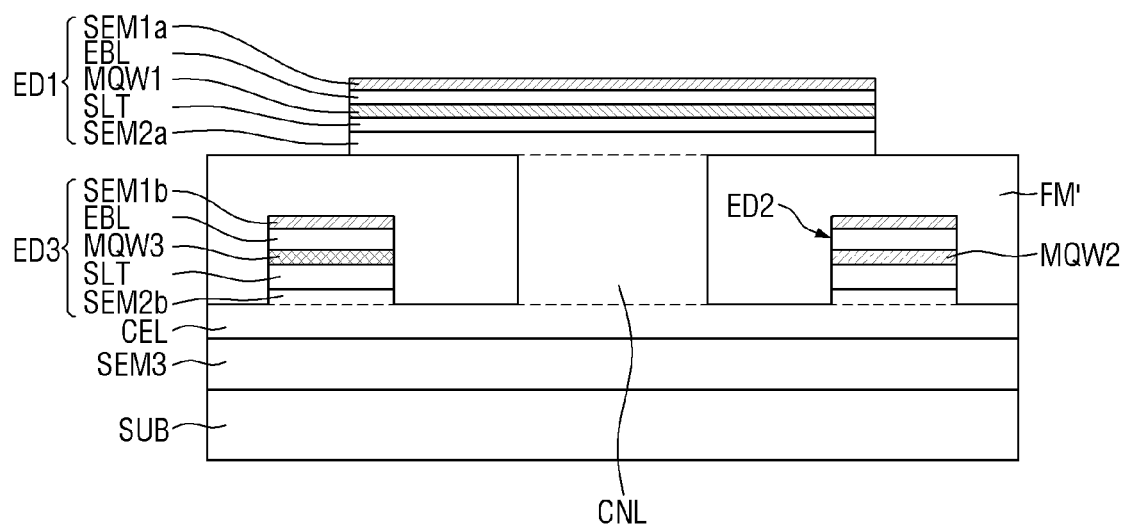

Subsequently, referring to FIGS. 5 and 13, the first light-emitting diode ED1 is formed (S20). The width of the first light-emitting diode ED1 may be greater than the width of the connection electrode layer CNL, and the second light-emitting diode ED2 and/or the third light-emitting diode ED3 might not overlap the connection electrode layer CNL in the thickness direction. The structure of the first light-emitting diode ED1 has been described above with reference to FIG. 4. Therefore, the redundant descriptions thereof will be omitted.

Figure 14:
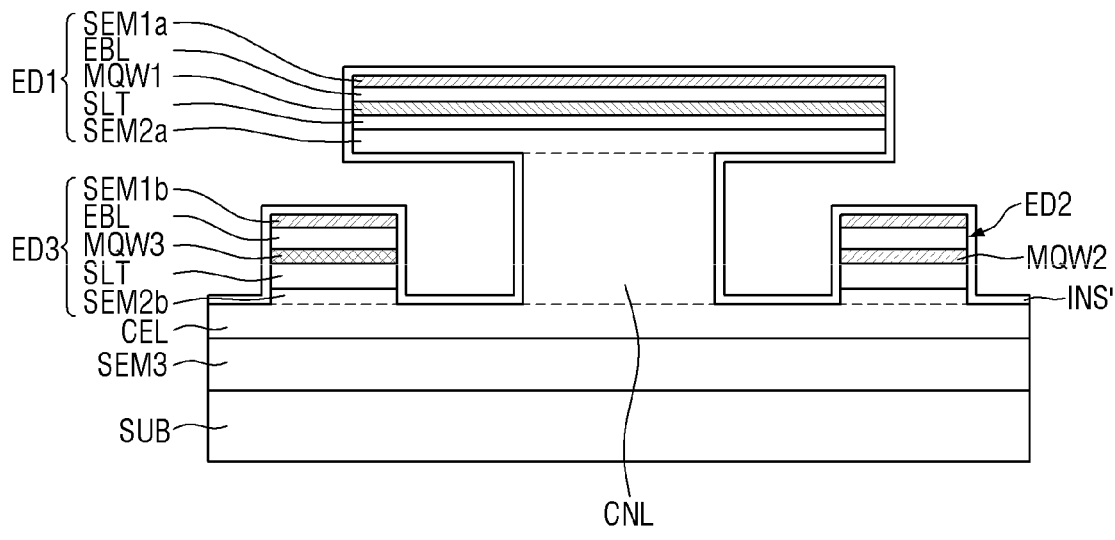

Subsequently, referring to FIG. 14, after the filling layer FM' has been removed, an insulating layer INS' is formed entirely on the side surfaces of the light-emitting diodes ED1, ED2, and ED3 and on the common electrode layer CEL. The insulating layer INS' may be formed directly on the side surfaces of the light-emitting diodes ED1, ED2, and ED3 and on the surfaces of the common electrode layer CEL where the light-emitting diodes ED1, ED2, and ED3 are not located. The insulating layer INS' may be located on the side surfaces of the connection electrode layer CNL and the surface of the second semiconductor layer SEM2*a* (the surface facing the common electrode layer CEL) as well. The insulating layer INS' may include an inorganic insulating material such as silicon oxide (SiOx), silicon nitride (SiNx), silicon oxynitride (SiOxNy), aluminum oxide (AlOy), and aluminum nitride (AlNx).

Figure 15:
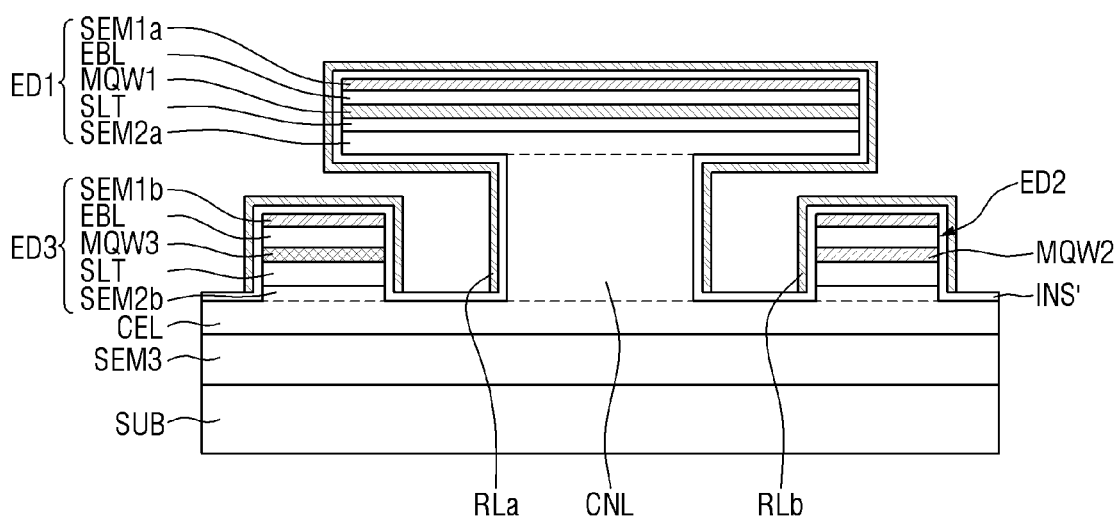

Subsequently, referring to FIG. 15, reflective layers RLa and RLb are formed. The reflective layers RLa and RLb may be located on the light-emitting diodes ED1, ED2, and ED3 but might not be formed on the common electrode layer CEL between the light-emitting diodes ED1, ED2, and ED3. The reflective layers RLa and RLb may include a metal material having high reflectance, such as aluminum (Al).

Figure 16:
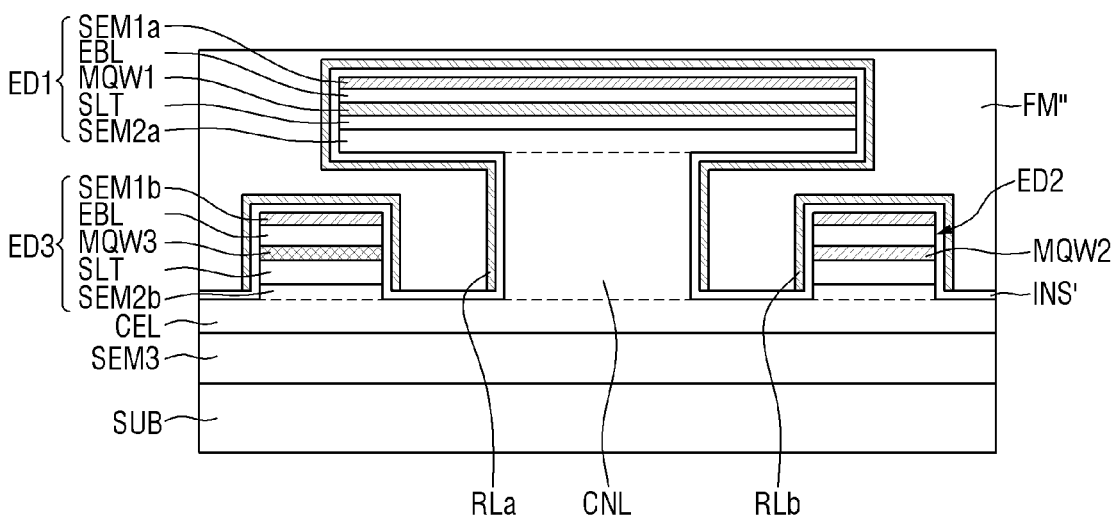

Subsequently, referring to FIG. 16, a filling layer FM" is formed. The filling layer FM" may be formed over the common electrode layer CEL to compensate for the level differences created by the first to third light-emitting diodes ED1 to ED3, to provide a flat surface. The material of the filling layer FM" is identical to that of the filling layer FM of FIG. 4. Therefore, redundant descriptions thereof will be omitted.

Figure 17:
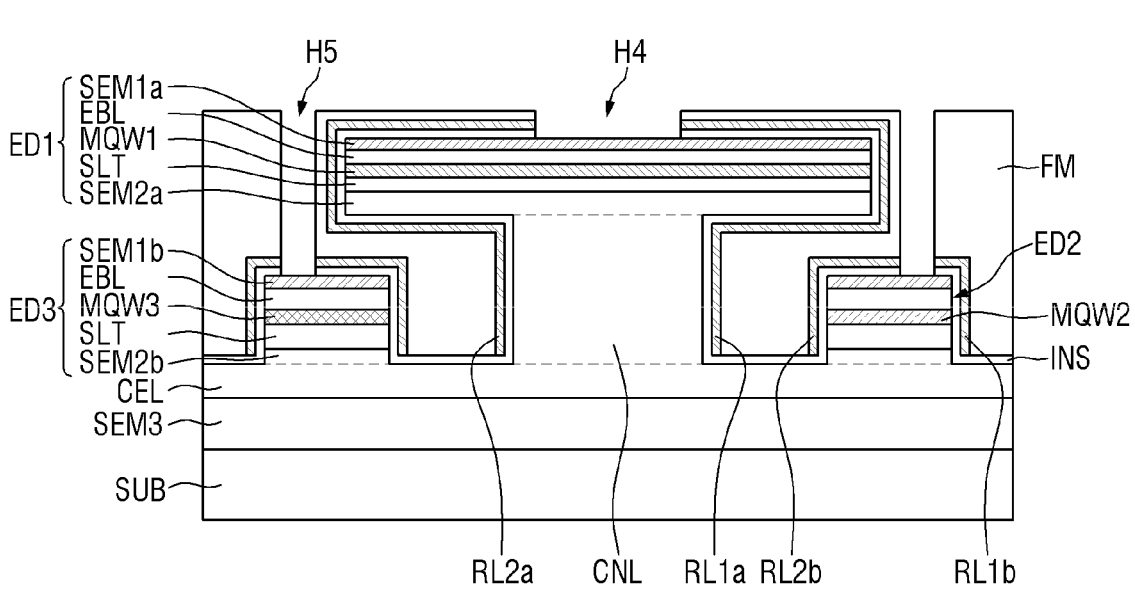

Subsequently, as shown in FIG. 17, fourth and fifth holes H4 and H5 are formed. The fourth hole H4 penetrates the filling layer FM, the reflective layer RL (see FIG. 16), and the insulating layer INS in thickness direction to expose the surface of the first semiconductor layer SEM1*a*. The fifth hole H5 penetrates the filling layer FM, the reflective layer RL (see FIG. 16) and the insulating layer INS to expose the surface of the first semiconductor layer SEM1*b*. The fourth and fifth holes H4 and H5 are formed by etching.

Figure 18:
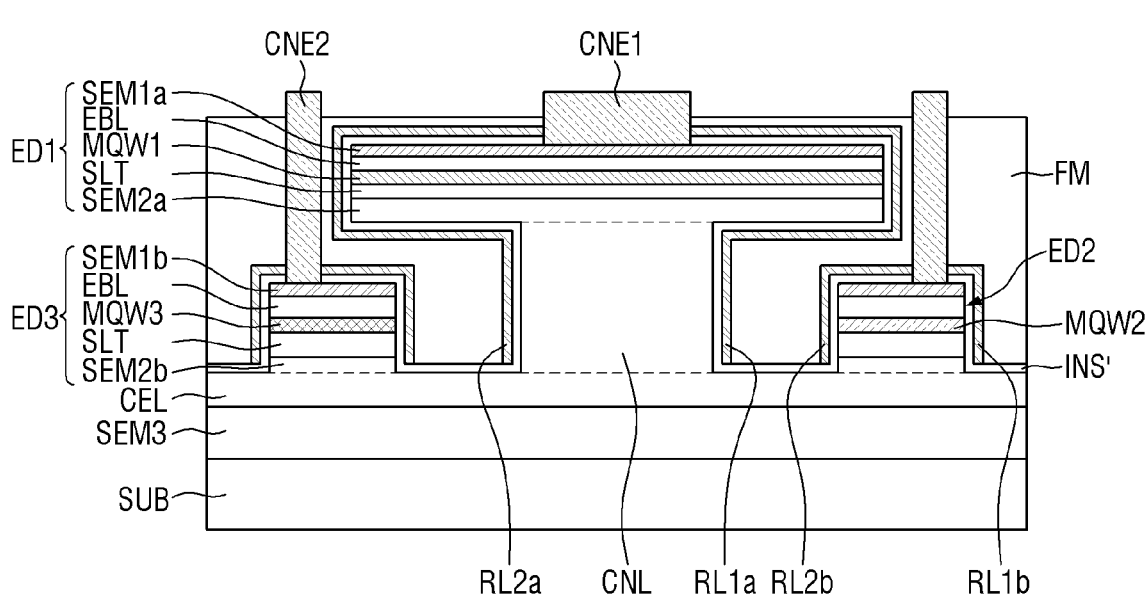

Subsequently, as shown in FIG. 18, the first and second connection electrodes CNE1 and CNE2 are formed. The connection electrodes CNE1 and CNE2 may include the first connection electrodes CNE1 on the light-emitting diodes ED1, and the second connection electrodes CNE2 on the second light-emitting diodes ED2 and/or the third light-emitting diodes ED3.

The first connection electrodes CNE1 and the second connection electrodes CNE2 may be located in line with the light-emitting diodes ED1, ED2, and ED3 and pixel electrodes AE to be described later in the display area DA. The first connection electrodes CNE1 may be located on the surfaces of the first semiconductor layers SEM1*a* of the first light-emitting diodes ED1, while the second connection electrodes CNE2 may be located on the surfaces of the first semiconductor layers SEM1*b* of the second light-emitting diodes ED2 and the third light-emitting diodes ED3.

The connection electrodes CNE1 and CNE2 may be electrically connected to the pixel electrode AE to transmit emission signals applied to the pixel electrodes AE to the light-emitting diodes ED1, ED2, and ED3, respectively. The connection electrodes CNE1 and CNE2 may be ohmic connection electrodes. It is, however, to be understood that the present disclosure is not limited thereto. The connection electrodes CNE1 and CNE2 may be Schottky connection electrodes. The width of the connection electrodes CNE1 and CNE2 may be less than the width of the light-emitting diodes ED1, ED2, and ED3. The connection electrodes CNE1 and CNE2 may be located on only a part of the surface of the first semiconductor layers SEM1*a* and SEM1*b*, and the insulating layer INS may be located on the other part.

The connection electrodes CNE1 and CNE2 may be located directly on the pixel electrodes AE and may be in contact with them. The connection electrodes CNE1 and CNE2 may work as bonding metals for bonding the pixel electrodes AE with the light-emitting diodes ED1, ED2, and ED3 during the fabricating process. The connection electrodes CNE1 and CNE2 may include a material that can be electrically connected to the pixel electrodes AE and the light-emitting diodes ED1, ED2, and ED3. For example, the connection electrodes CNE1 and CNE2 may include at least one of gold (Au), copper (Cu), aluminum (Al) and tin (Sn), or may include a transparent conductive oxide such as indium tin oxide (ITO) and indium zinc oxide (IZO). Alternatively, the connection electrodes CNE1 and CNE2 may include a first layer including one of gold (Au), copper (Cu), aluminum (Al) and tin (Sn), a second layer including another one of gold (Au), copper (Cu), aluminum (Al), and tin (Sn).

The separation distance between the first light-emitting diode ED1 and the common electrode layer CEL in the thickness direction may be greater than the separation distance between the second light-emitting diode ED2 and the common electrode layer CEL in the thickness direction. In addition, the separation distance between the first light-emitting diode ED1 and the pixel electrode AE in the thickness direction may be less than the separation distance between the second light-emitting diode ED2 and the pixel electrode AE in the thickness direction (e.g., see FIG. 20). Accordingly, the length of the first connection electrode CNE1 in the thickness direction may be less than the length of the second connection electrode CNE2 in the thickness direction.

Figure 19:
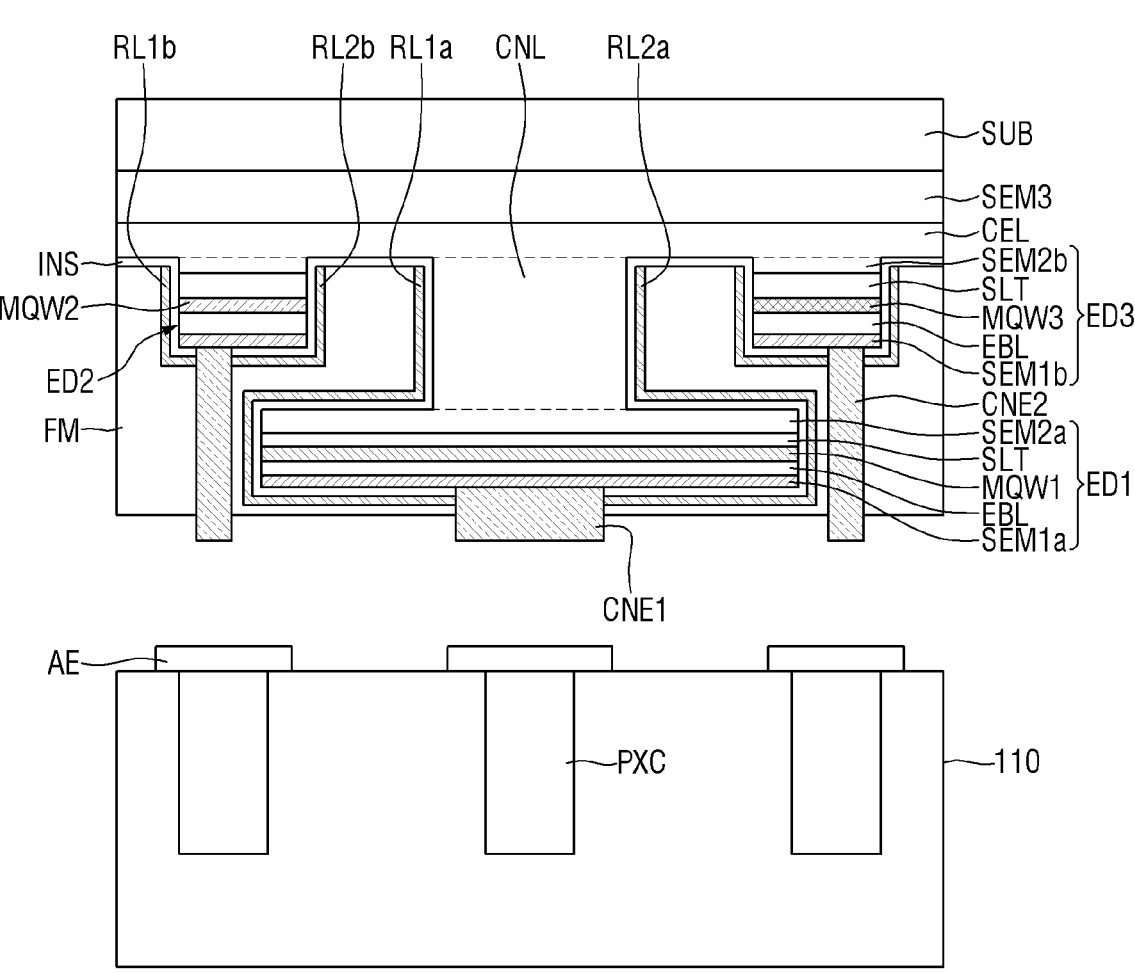
Figure 20:
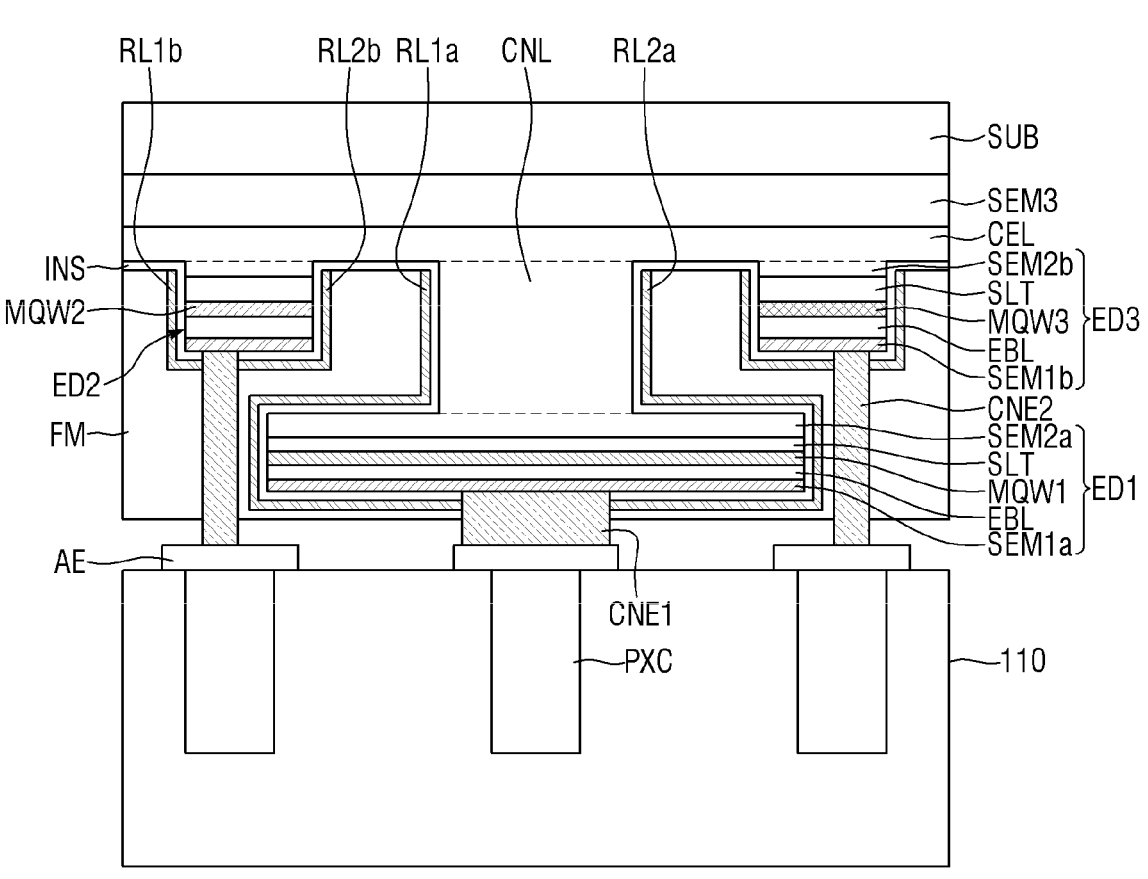

Subsequently, referring to FIGS. 19 and 20, the pixel electrodes AE and the connection electrodes CNE1 and CNE2 are placed such that they face each other on the first substrate 110, and then the pixel electrodes AE and the connection electrodes CNE1 and CNE2 are connected with each other, respectively.

Hereinafter, other embodiments of the present disclosure will be described.

Figure 21:
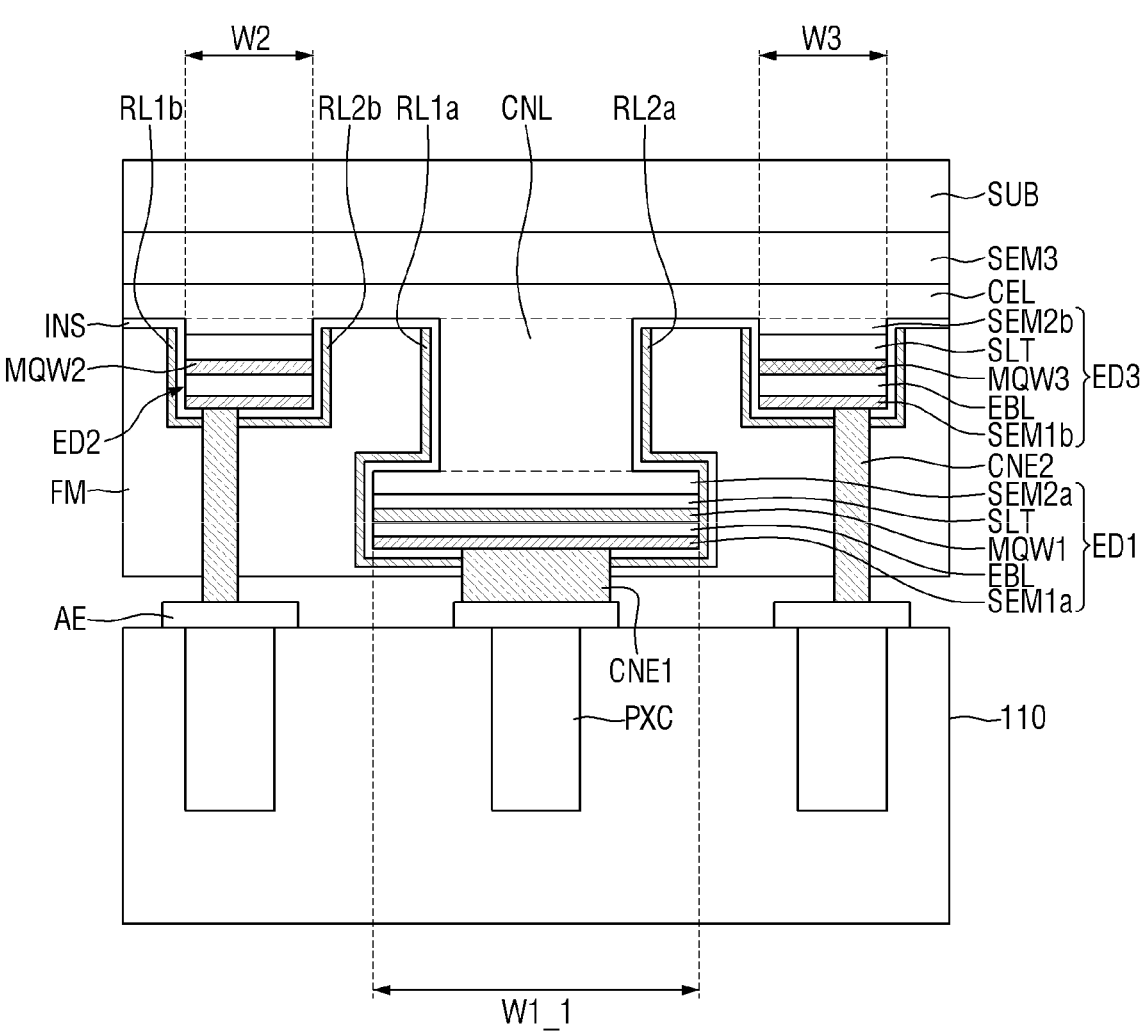
FIG. 21 is a cross-sectional view showing a display panel according to other embodiments of the present disclosure.

FIG. 21 is a cross-sectional view showing a display panel according to other embodiments of the present disclosure.

The display panel according to the embodiments corresponding to FIG. 21 is different from the display panel 100 of FIG. 4 in that a width W1_1 of the first light-emitting diode ED1 is greater than widths W2 and/or W3 of a second light-emitting diodes ED2 and/or a third light-emitting diode ED3, and that the first light-emitting diode ED1 does not overlap the second light-emitting diodes ED2 and/or the third light-emitting diode ED3 when viewed from the top.

The other elements are identical to those described above with reference to FIG. 4. Therefore, redundant description thereof will be omitted.

Figure 22:
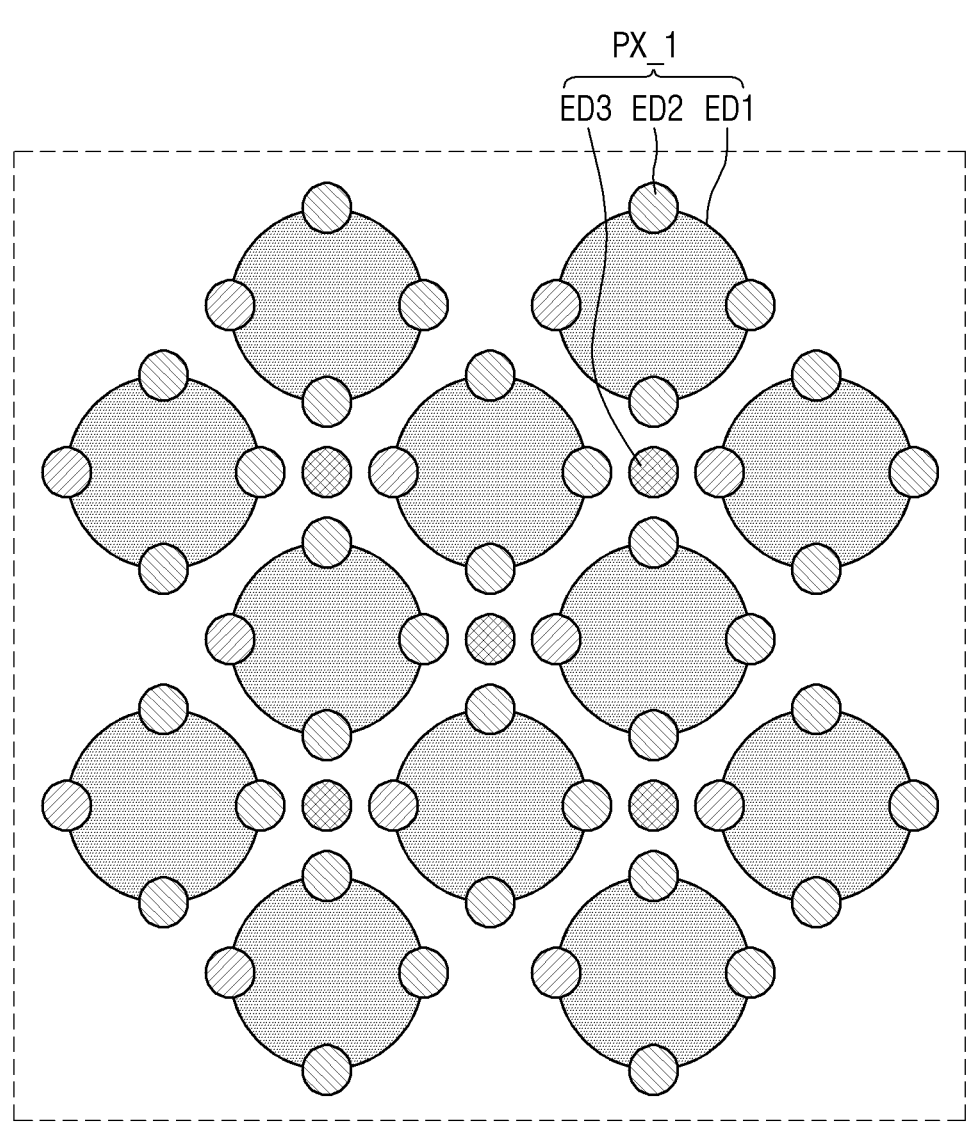
FIG. 22 is a plan view showing a layout of first to third light-emitting diodes according to other embodiments.

FIG. 22 is a plan view showing a layout of first to third light-emitting diodes according to other embodiments.

A pixel PX_1 according to the embodiments corresponding to FIG. 22 is different from the pixel PX of FIG. 3 in that the first to third light-emitting diodes ED1, ED2, and ED3 are arranged in a PenTile™ matrix/PENTILE™ arrangement structure (e.g., a PENTILE™ matrix structure, a PENTILE™ structure, an RGBG matrix structure, or an RGBG structure). PENTILE™ is a registered trademark of Samsung Display Co., Ltd., Republic of Korea.

For example, the first light-emitting diode ED1 of one pixel PX may overlap four second light-emitting diodes ED2 while not overlapping any third light-emitting diode ED3, when viewed from the top or in plan view. A third light-emitting diode ED3 of a particular/subject pixel PX may be located between a first light-emitting diode ED1 of an adjacent pixel PX (e.g., on the left side of the particular/subject pixel PX) and a first light-emitting diode ED1 of the particular pixel PX. Furthermore, the third light-emitting diode ED3 may be located between a first light-emitting diode ED1 of a pixel PX on the upper left side of the first light-emitting diode ED1 of the particular pixel PX, and a first light-emitting diode ED1 of a pixel PX on the lower left side of the first light-emitting diode ED1 of the particular pixel PX. The plurality of pixels PX may be arranged in a zigzag pattern in the horizontal direction, and rows of the pixels arranged in the zigzag pattern may be spaced apart from one another by a distance (e.g., a predetermined distance) in the vertical direction.

Figure 23:
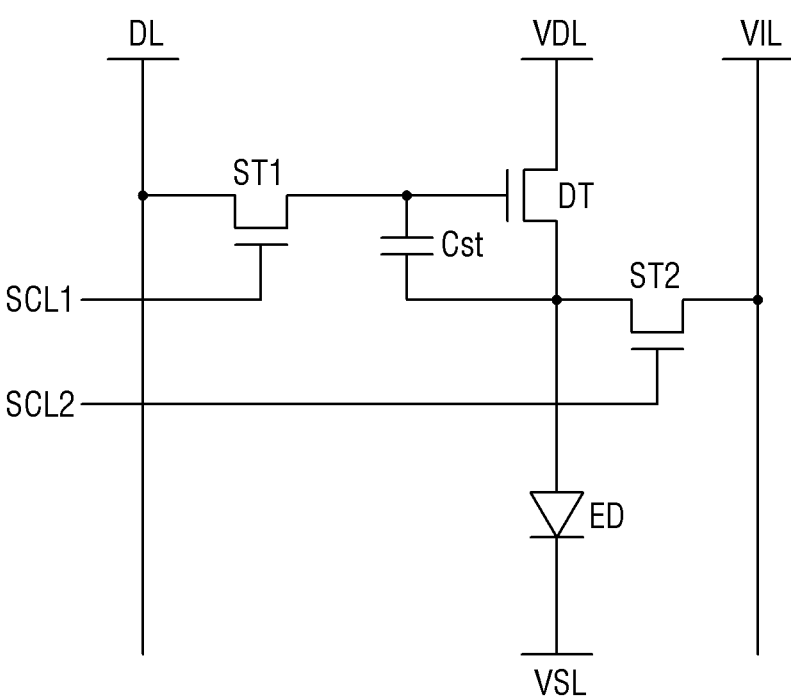
FIG. 23 is an equivalent circuit diagram of a pixel of a display device according to some embodiments of the present disclosure.

FIG. 23 is an equivalent circuit diagram of a pixel of a display device according to some embodiments of the present disclosure. FIG. 23 shows an example of a pixel circuit diagram included in one pixel PX of FIG. 3.

Referring to FIG. 23, the light-emitting diodes ED1, ED2, and ED3 emit light in response to the driving current. The amount of the light emitted from the light-emitting diodes ED1, ED2, and ED3 may be proportional to the driving current. Each of the light-emitting diodes ED1, ED2, and ED3 may be an inorganic light-emitting element including an anode electrode, a cathode electrode, and an inorganic semiconductor located between the anode electrode and the cathode electrode.

The anode electrode of the light-emitting diodes ED1, ED2, and ED3 may be connected to the source electrode of a driving transistor DT, and the cathode electrode may be connected to a second supply voltage line VSL from which a low-level voltage that is lower than the high-level voltage is applied.

The driving transistor DT adjusts a current flowing from a first supply voltage line VDL, from which the first supply voltage is supplied, to the light-emitting diodes ED1, ED2, and ED3, respectively, according to the voltage difference between the gate electrode and the source electrode. The gate electrode of the driving transistor DT may be connected to a first electrode of a first transistor ST1, the source electrode thereof may be connected to the anode electrode of the light-emitting diodes ED1, ED2, and ED3, respectively, and the drain electrode thereof may be connected to a first supply voltage line VDL to which the high-level voltage is applied.

The first transistor ST1 is turned on by a first scan signal of a first scan line SCL1 to connect a data line DL with the gate electrode of the driving transistor DT. The gate electrode of the first transistor ST1 may be connected to the first scan line SCL1, the first electrode thereof may be connected to the gate electrode of the driving transistor DT, and the second electrode thereof may be connected to the data line DL.

The second transistor ST2 is turned on by a second scan signal of a second scan line SCL2 to connect an initialization voltage line VIL with the source electrode of the driving transistor DT. The gate electrode of the second transistor ST2 may be connected to the second scan line SCL2, the first electrode thereof may be connected to the initialization voltage line VIL, and the second electrode thereof may be connected to the source electrode of the driving transistor DT.

The first electrode of each of the first and second transistors ST1 and ST2 may be a source electrode, and the second electrode may be a drain electrode, but the present disclosure is not limited thereto. That is, the first electrode of each of the first and second transistors ST1 and ST2 may be a drain electrode, and the second electrode thereof may be a source electrode.

The capacitor Cst may be formed between the gate electrode and the source electrode of the driving transistor DT. The capacitor Cst is configured to store a voltage equal or corresponding to the difference between the gate voltage and the source voltage of the driving transistor DT.

Although FIG. 23 shows that each of the driving transistor DT and the first and second transistors ST1 and ST2 is implemented as an n-type MOSFET (metal oxide semiconductor field effect transistor), it is to be noted that the present disclosure is not limited thereto. Each of the driving transistor DT and the first and second transistors ST1 and ST2 may be implemented as a p-type MOSFET in some embodiments.

It should be noted that the display device for displaying an image according to some embodiments may be applied to various apparatuses and devices.

Figure 24:
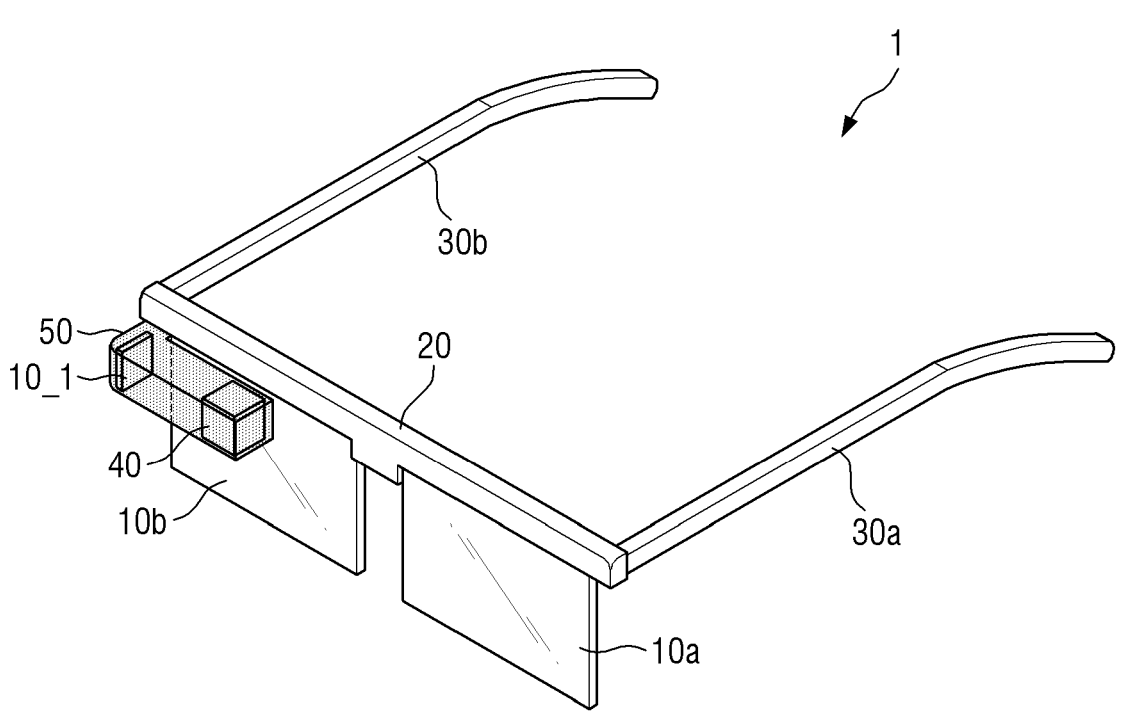
FIGS. 24 to 26 are views showing applications of a display device according to some embodiments of the present disclosure.
Figure 25:
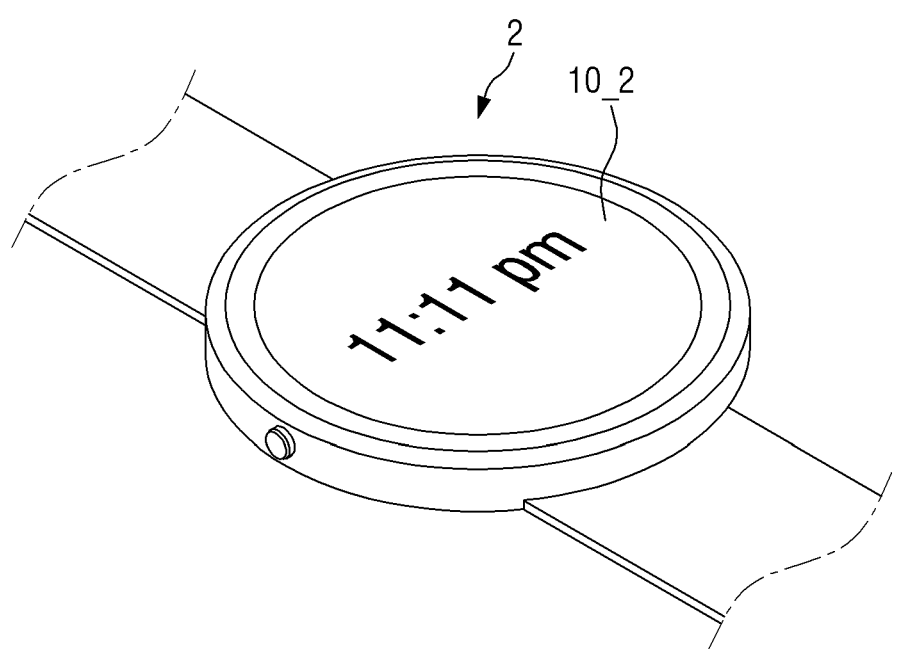
Figure 26:
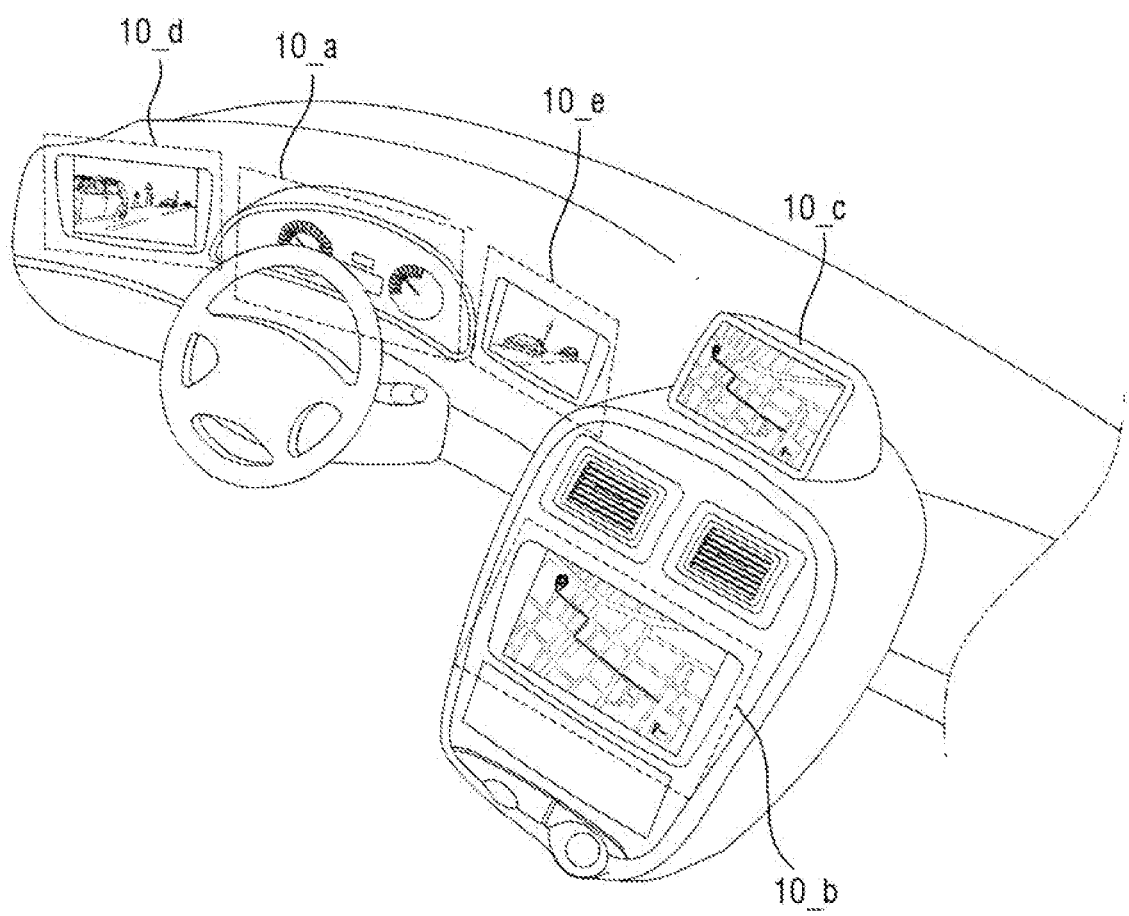

FIG. 24 shows a virtual reality device 1 to which a display device 10 according to some embodiments is applied. FIG. 25 shows a smart watch 2 to which a display device 10 according to some embodiments is applied. FIG. 26 shows a vehicle in which display devices 10_a, 10_b, 10_c, 10_d and 10_e according to some embodiments are applied as displays.

Referring to FIG. 24, the virtual reality device 1 according to some embodiments may be a device in the form of glasses. The virtual reality device 1 according to some embodiments of the present disclosure may include a display device 10, a left eye lens 10a, a right eye lens 10b, a support frame 20, eyeglass temples 30a and 30b, a reflective member 40, and a display device case 50.

Although the virtual reality device 1 including the eyeglass temples 30a and 30b is shown in the drawing, a head mounted display with a head strap, instead of the eyeglass temples 30a and 30b, may be employed as the virtual reality device 1 according to some embodiments of the present disclosure. It is to be understood that the virtual reality device 1 is not limited to that shown in the drawings but may be applied in a variety of electronic devices in a variety of forms.

The display device case 50 may include the display device 10 and the reflective member 40. An image displayed on the display device 10 may be reflected by the reflective member 40 and provided to the user's right eye through the right eye lens 10b. Accordingly, the user may watch a virtual reality image displayed on the display device 10 through the right eye.

Although the display device case 50 may be located at the right end of the support frame 20, the embodiments of the present disclosure are not limited thereto. For example, the display device case 50 may be located at the left end of the support frame 20. In such case, an image displayed on the display device 10 is reflected by the reflective member 40 and provided to the user's left eye through the left eye lens 10a. Accordingly, the user may watch a virtual reality image displayed on the display device 10 through the left eye. Alternatively, the display device cases 50 may be located at both the left and right ends of the support frame 20, respectively. In such case, the user can watch a virtual reality image displayed on the display device 10 through both the left and right eyes.

Referring to FIG. 25, a display device 10 according to some embodiments may be applied to a smart watch 2, which is a type of smart device.

Referring to FIG. 26, display devices 10_a, 10_b and 10_c according to some embodiments of the present disclosure may be applied to the instrument cluster of a vehicle, may be applied to the center fascia of a vehicle, or may be applied to a center information display (CID) located on the dashboard of a vehicle. In addition, the display devices 10_d and 10_e according to some embodiments of the present disclosure may be applied to room mirror displays, which can replace side mirrors of the vehicle.

Figure 27:
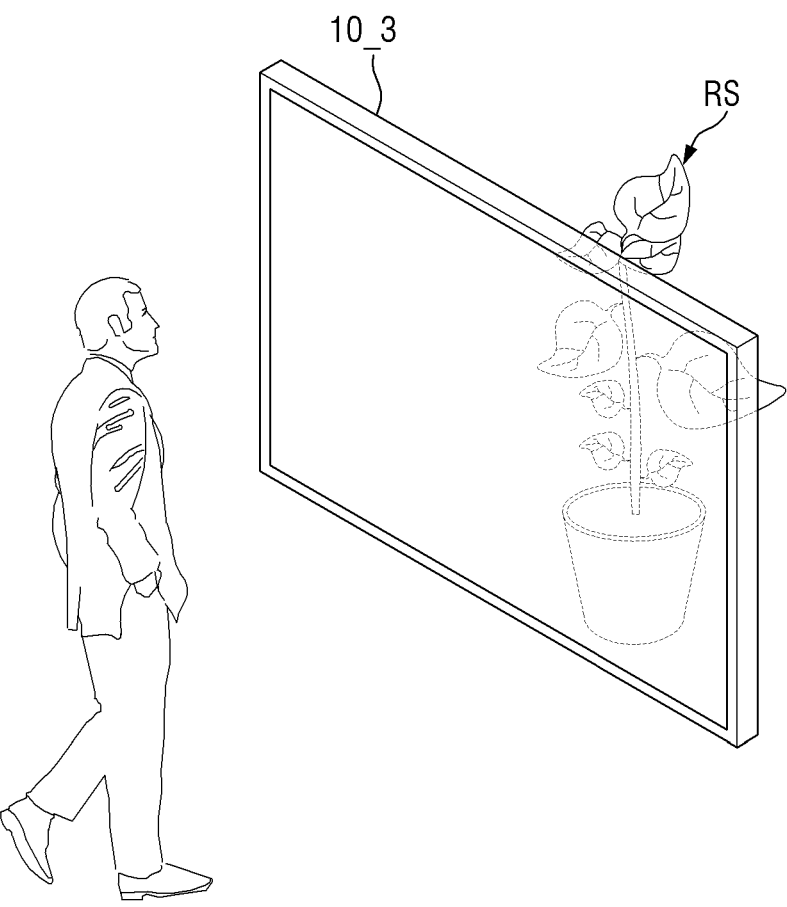
FIGS. 27 and 28 are views showing an example of a transparent display device including a display device according to some embodiments.
Figure 28:
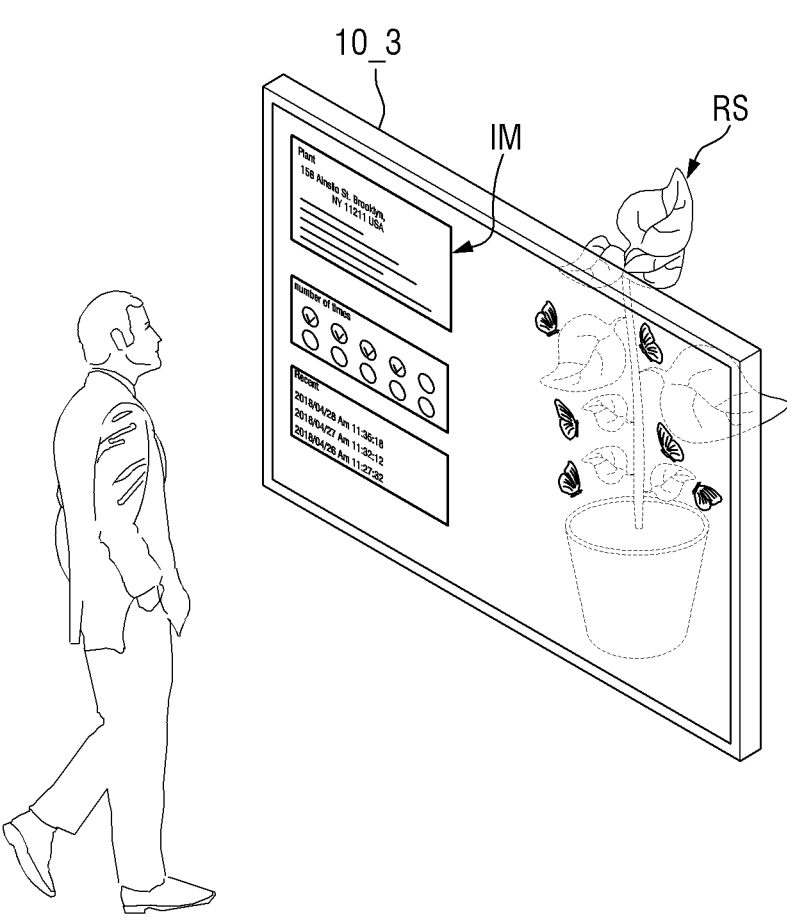

FIGS. 27 and 28 are views showing an example of a transparent display device including a display device according to some embodiments.

Referring to FIGS. 27 and 28, a display device 10 according to some embodiments may be applied to a transparent display device. The transparent display device may transmit light while displaying images IM. A user located on the front side of the transparent display device may not only watch the images IM displayed on the display device 10, but also may watch an object RS or the background located on the rear side of the transparent display device.

Although embodiments of the present disclosure have been disclosed for illustrative purposes, those skilled in the art will appreciate that various modifications, additions and substitutions are possible, without departing from the scope and spirit of the present disclosure and the claimed embodiments as disclosed in the accompanying claims, with functional equivalents thereof to be included therein.

What is claimed is:

1. A display device comprising:
light-emitting elements arranged on a circuit substrate, extending in a thickness direction of the circuit substrate, and comprising a first light-emitting element configured to emit a first light, and a second light-emitting element configured to emit a second light, and having a width that is less than a width of the first light-emitting element;
a common electrode layer above the light-emitting elements; and
a connection electrode layer between the first light-emitting element and the common electrode layer,
wherein the first light-emitting element partially overlaps the second light-emitting element in the thickness direction.

2. The display device of claim 1, wherein the first light-emitting element is on a different layer from the second light-emitting element.

3. The display device of claim 2, wherein the light-emitting elements further comprise a third light-emitting element configured to emit a third light, and on a different layer from the first light-emitting element.

4. The display device of claim 3, wherein the third light-emitting element is on a same layer as the second light-emitting element.

5. The display device of claim 4, wherein the width of the first light-emitting element is greater than a width of the third light-emitting element.

6. The display device of claim 4, wherein portions of the first light-emitting element respectively overlap the second light-emitting element and the third light-emitting element in a plan view.

7. The display device of claim 2, wherein the connection electrode layer does not overlap with the second light-emitting element.

8. The display device of claim 2, wherein the connection electrode layer comprises a same material as the common electrode layer.

9. The display device of claim 2, wherein a width of the connection electrode layer is less than the width of the first light-emitting element.

10. The display device of claim 1, wherein the light-emitting elements comprise:
a first semiconductor layer on the circuit substrate;
an active layer on the first semiconductor layer; and
a second semiconductor layer on the active layer.

11. The display device of claim 10, wherein the light-emitting elements further comprise an electron-blocking layer between the first semiconductor layer and the active
layer, and a superlattice layer between the active layer and
the second semiconductor layer.

12. The display device of claim 11, wherein the circuit
substrate further comprises pixel electrodes, and
    wherein the first semiconductor layer of the light-emitting
        elements is connected to a respective one of the pixel
        electrodes.

13. The display device of claim 12, further comprising a
connection electrode between the first semiconductor layers
of the light-emitting elements and the pixel electrodes.

14. The display device of claim 13, wherein a length of the
connection electrode of the first light-emitting element is
less than a length of the connection electrode of the second
light-emitting element.

15. The display device of claim 10, wherein the connec-
tion electrode layer comprises a same material as the second
semiconductor layer.

* * * * *